United States Patent
Korta et al.

(10) Patent No.: US 12,262,506 B2
(45) Date of Patent: Mar. 25, 2025

(54) RACK WITH TRAYS FOR PLUG-IN AUTOMOTIVE CONTROL UNITS

(71) Applicant: Aptiv Technologies AG, Schaffhausen (CH)

(72) Inventors: Jakub Antoni Korta, Cracow (PL); Tobias Merten, Düsseldorf (DE); Peter Reinhold, Gummersbach (DE)

(73) Assignee: Aptiv Technologies AG, Schaffhausen (CH)

( * ) Notice: Subject to any disclaimer, the term of this patent is extended or adjusted under 35 U.S.C. 154(b) by 343 days.

(21) Appl. No.: 17/930,609

(22) Filed: Sep. 8, 2022

(65) Prior Publication Data
US 2023/0077114 A1 Mar. 9, 2023

Related U.S. Application Data

(60) Provisional application No. 63/242,138, filed on Sep. 9, 2021.

(51) Int. Cl.
*H05K 7/20* (2006.01)
*H05K 7/14* (2006.01)
*H05K 7/16* (2006.01)

(52) U.S. Cl.
CPC ....... *H05K 7/20254* (2013.01); *H05K 7/1489* (2013.01); *H05K 7/16* (2013.01); *H05K 7/20772* (2013.01)

(58) Field of Classification Search
CPC .... H05K 7/20254; H05K 7/1489; H05K 7/16; H05K 7/20772; H05K 7/20854; H05K 5/0065; H05K 7/20809; H05K 7/20836; H05K 7/209
See application file for complete search history.

(56) References Cited

U.S. PATENT DOCUMENTS

| | | | |
|---|---|---|---|
| 7,212,409 B1 | 5/2007 | Belady et al. | |
| 10,539,753 B1 * | 1/2020 | Leigh | G02B 6/4268 |
| 10,874,032 B2 * | 12/2020 | Leigh | H05K 7/20636 |
| 11,765,848 B2 * | 9/2023 | Scott | H05K 7/20709 |
| | | | 361/679.01 |
| 2019/0269041 A1 * | 8/2019 | Lipp | H05K 7/1489 |
| 2021/0072473 A1 * | 3/2021 | Wall, Jr. | H05K 1/0274 |

OTHER PUBLICATIONS

"Extended European Search Report", EP Application No. 22194664.3, Jan. 20, 2023, 8 pages.

* cited by examiner

*Primary Examiner* — Adam B Dravininkas
(74) *Attorney, Agent, or Firm* — Harness, Dickey & Pierce, P.L.C.

(57) ABSTRACT

A rack assembly unit for mounting a control unit to a vehicle rack system is provided; a rack chassis and a tray are configured to receive the control unit for coupling to a vehicle system. The tray is movably coupled to the rack chassis at a coupling mechanism, which provides for movement of the tray relative to the rack chassis between open and closed positions. At the open position, the tray is spaced apart from rack chassis to facilitate user access to the tray and receiving the control unit therein. At the closed position, the tray is located fully inserted relative to the rack chassis and such that the control unit located in the tray is provided at a control unit operating position thermally coupled to a cold plate of a cooling system to provide for cooling of components of the control unit.

13 Claims, 24 Drawing Sheets

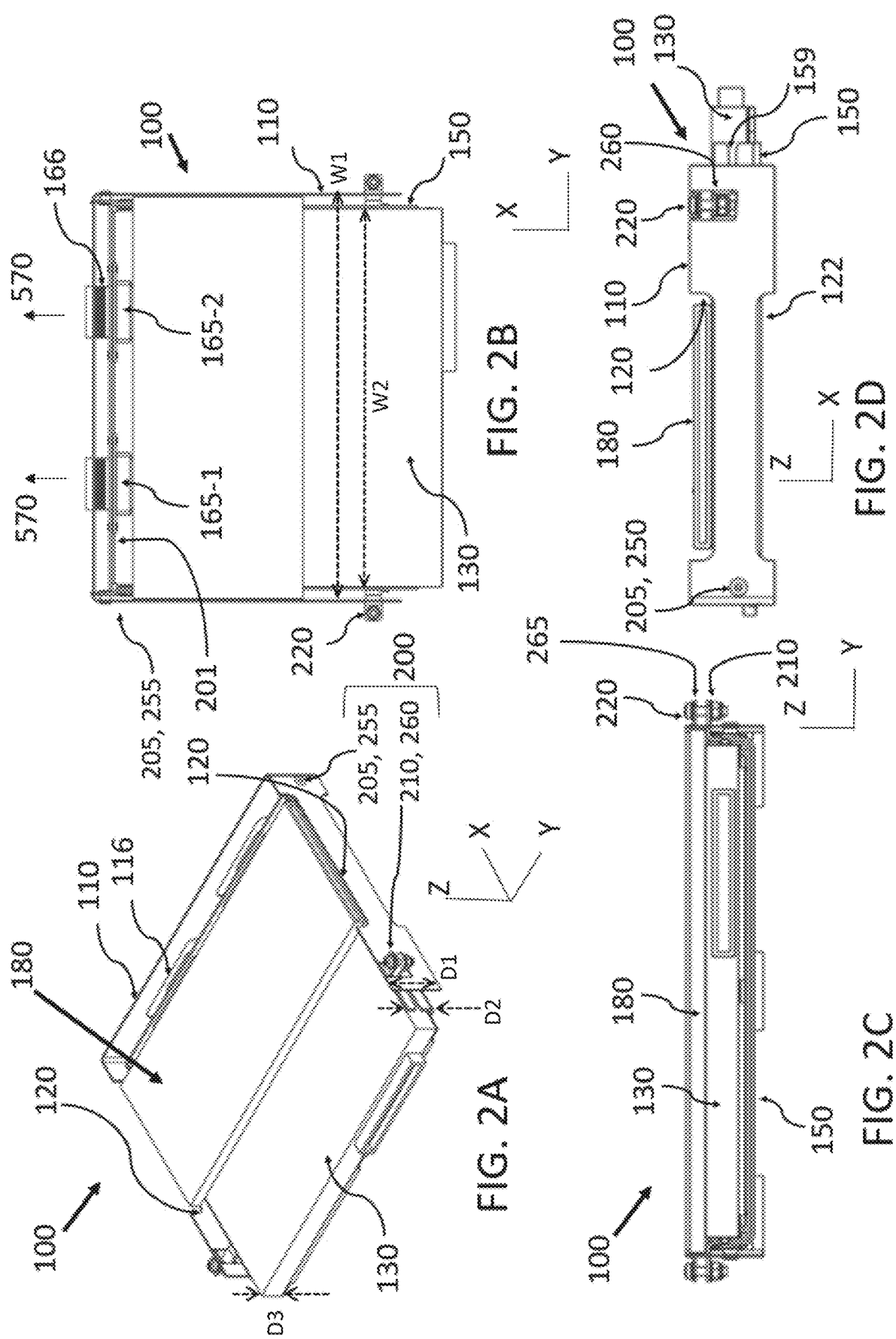

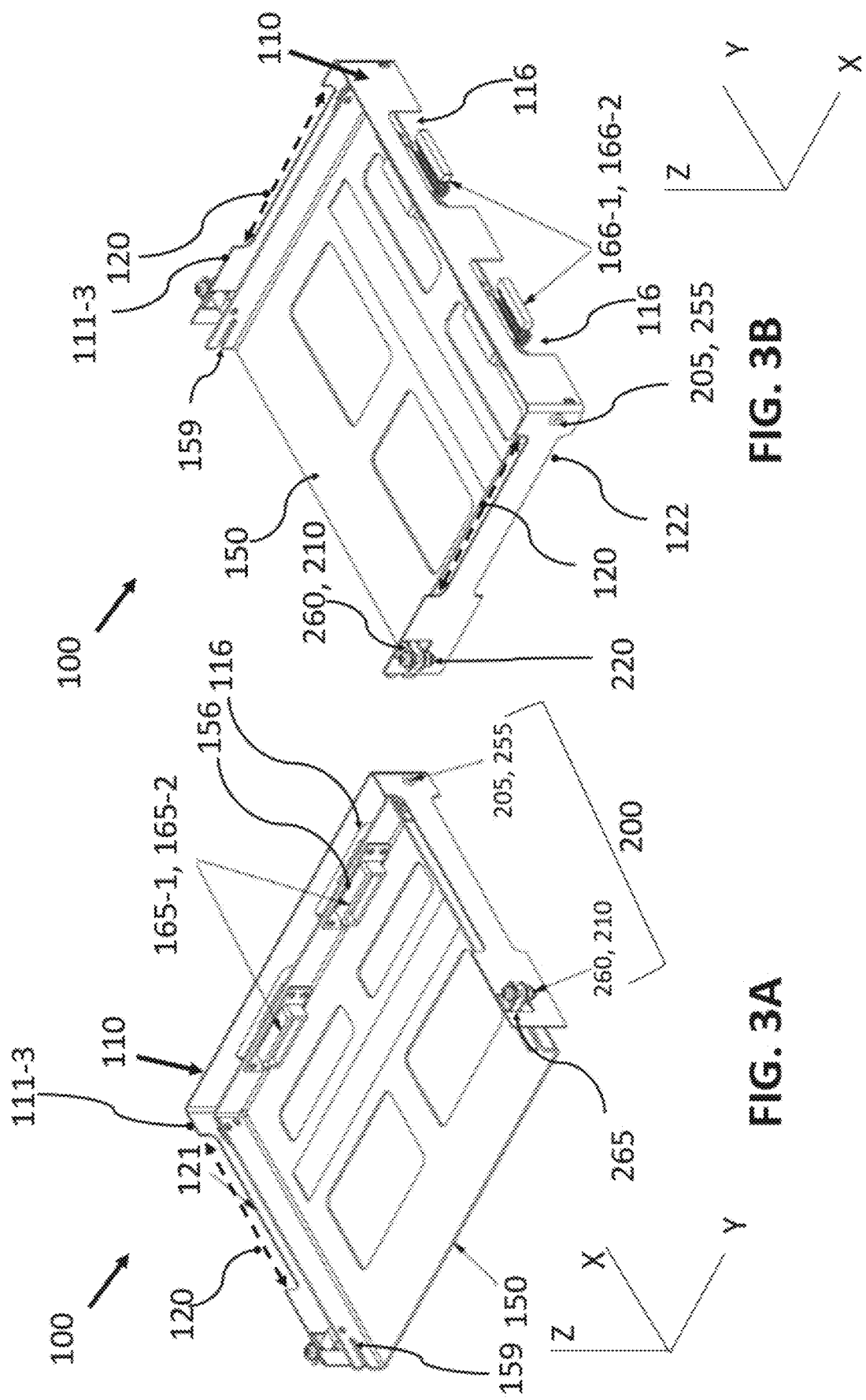

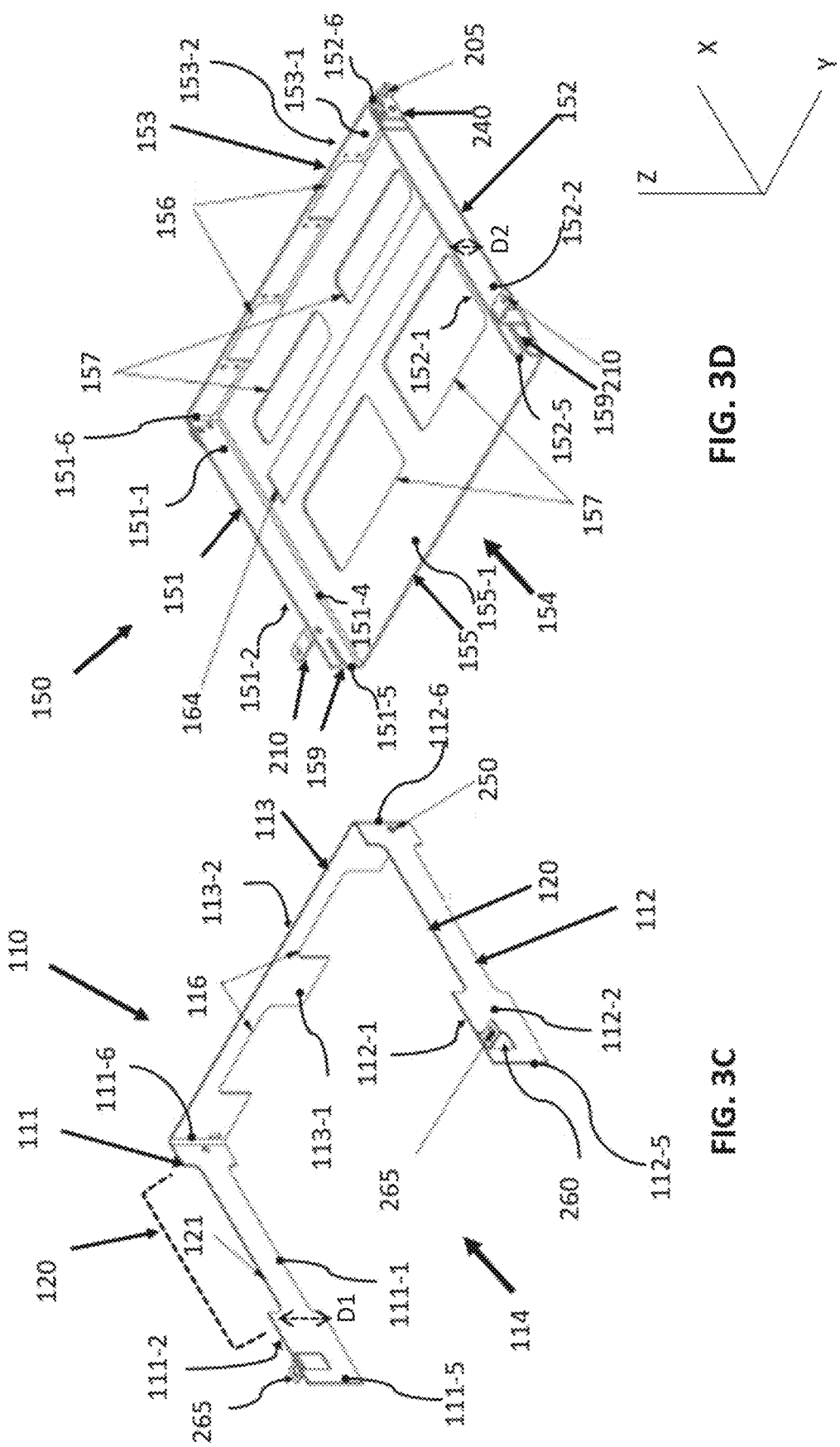

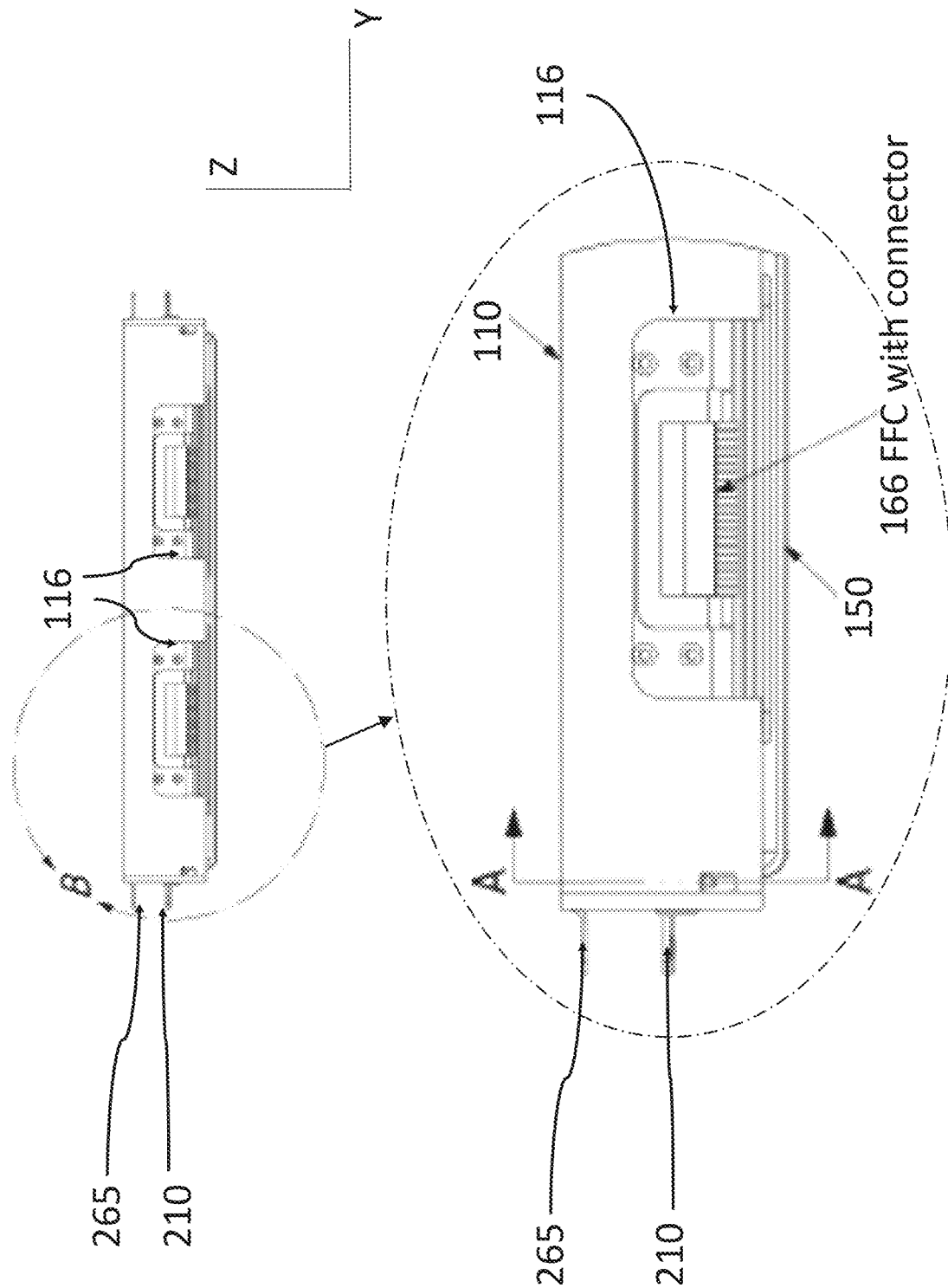

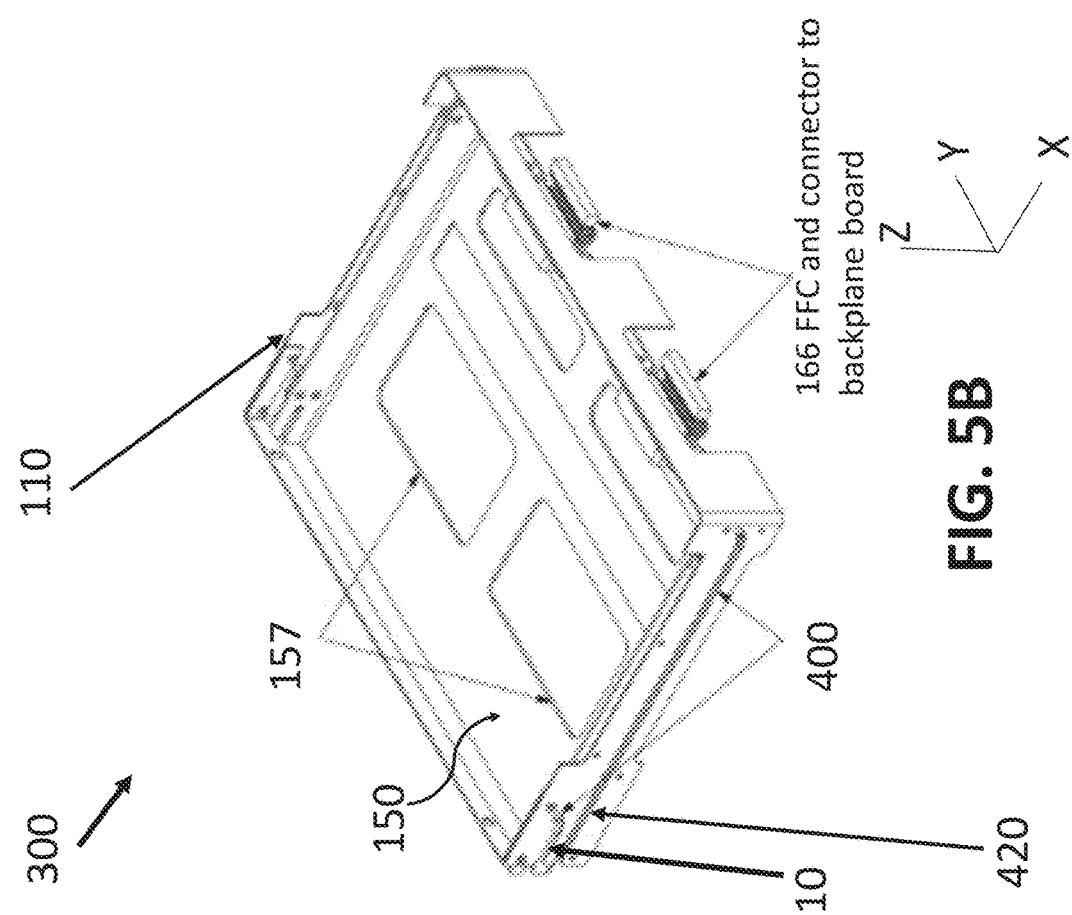
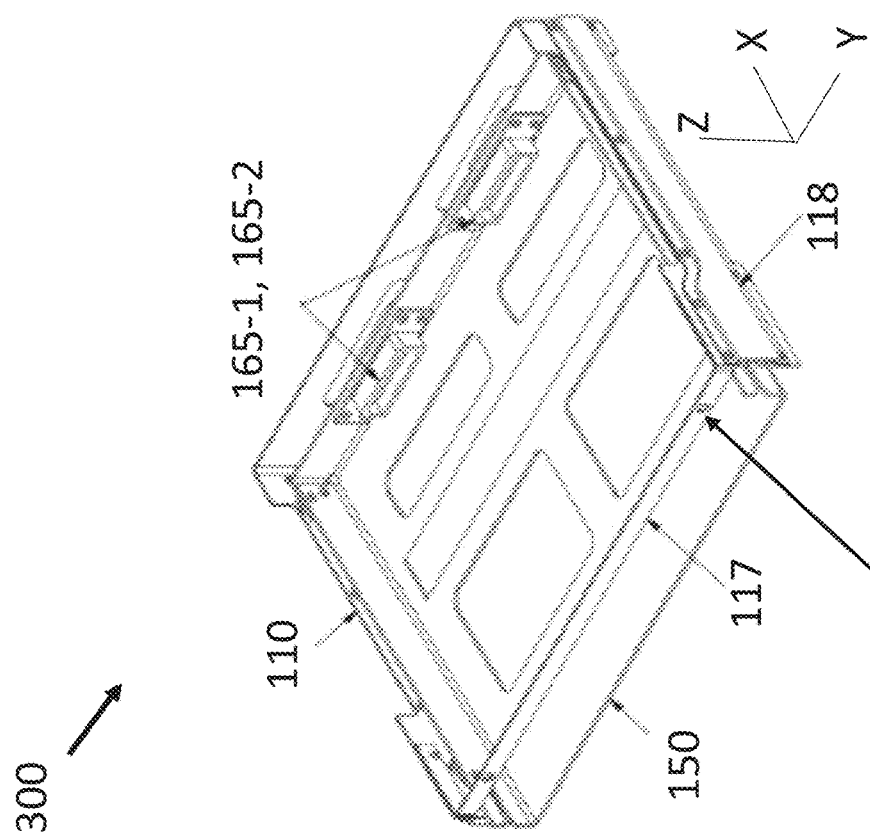
FIG. 5B
FIG. 5A

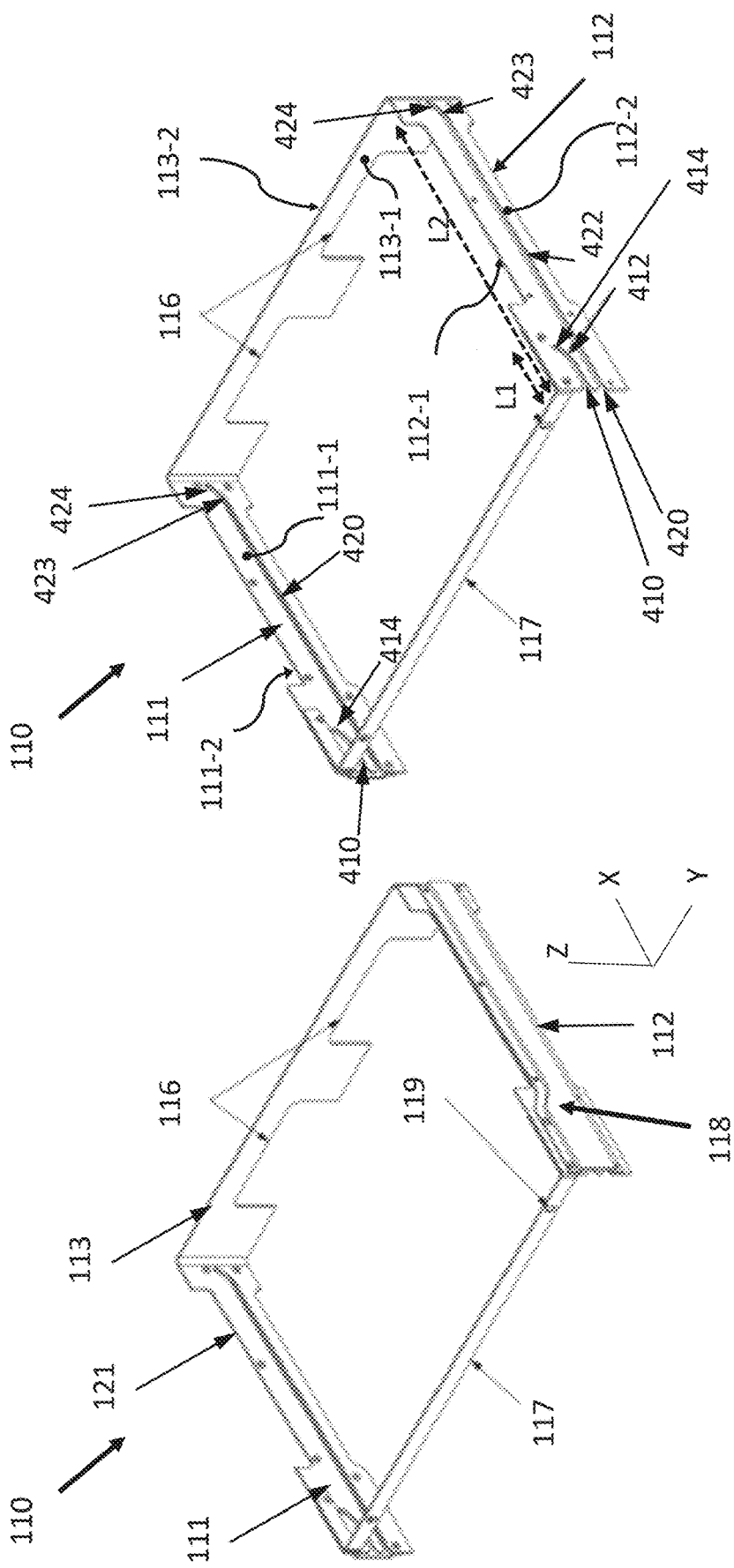

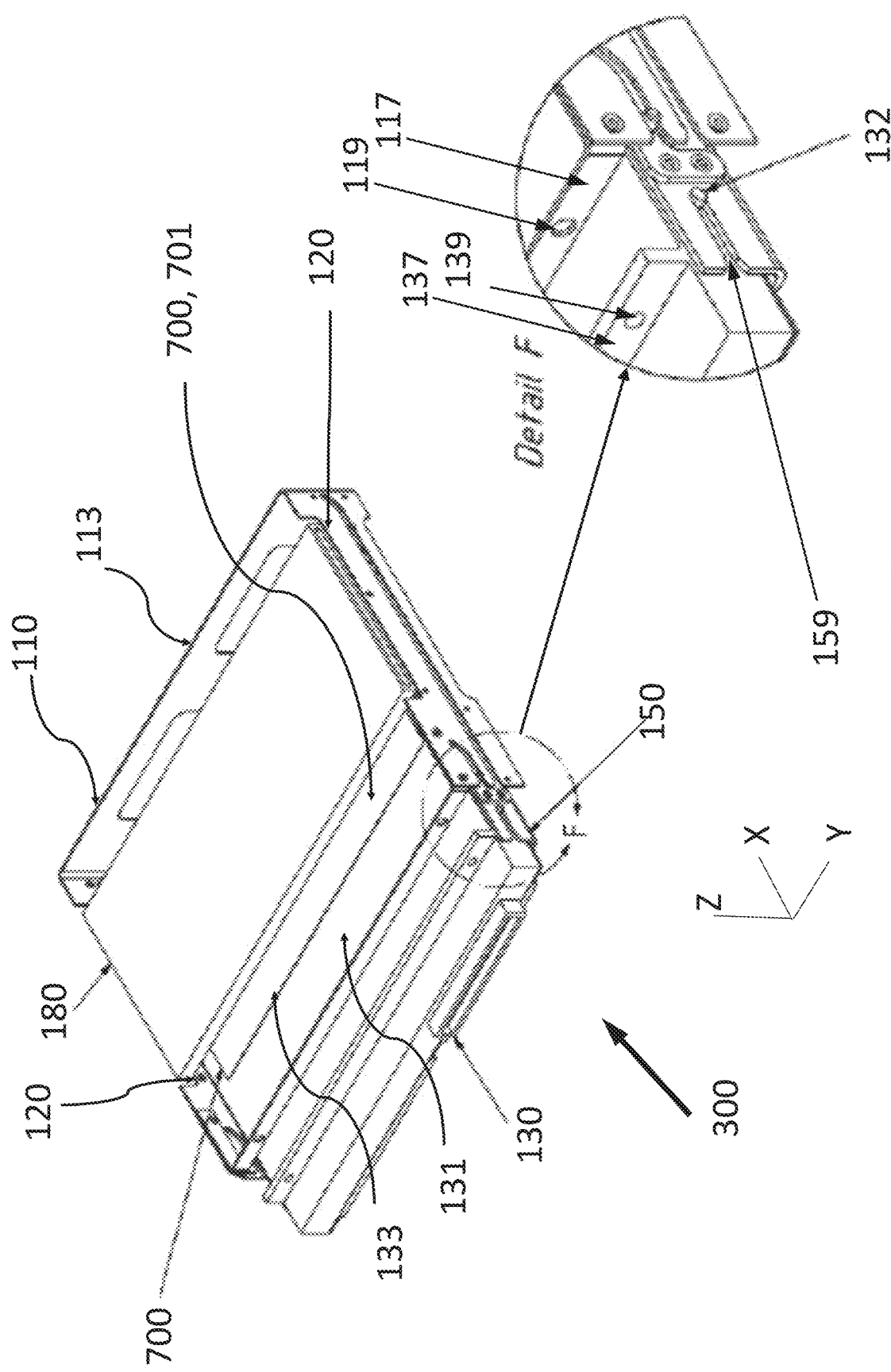

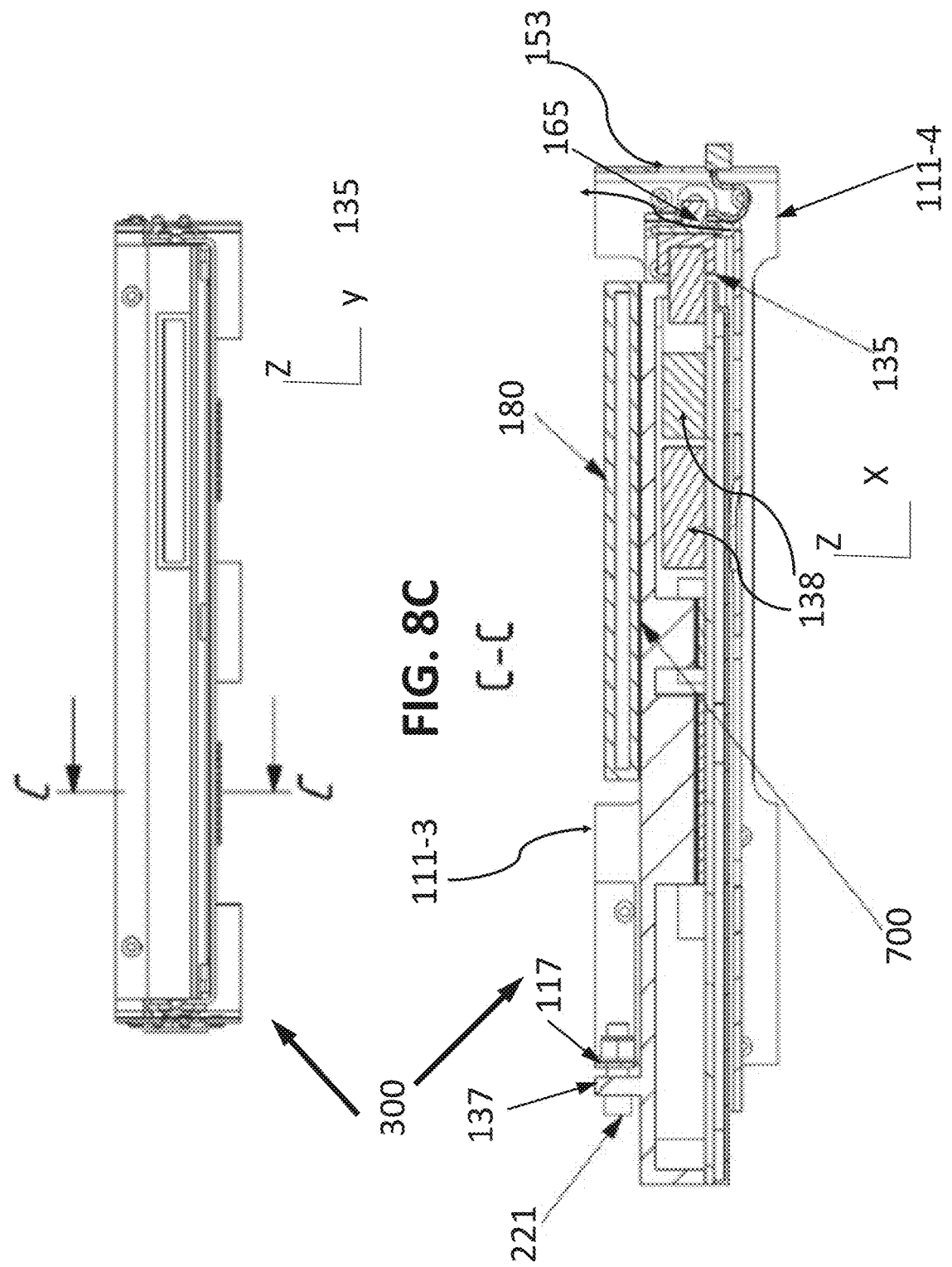

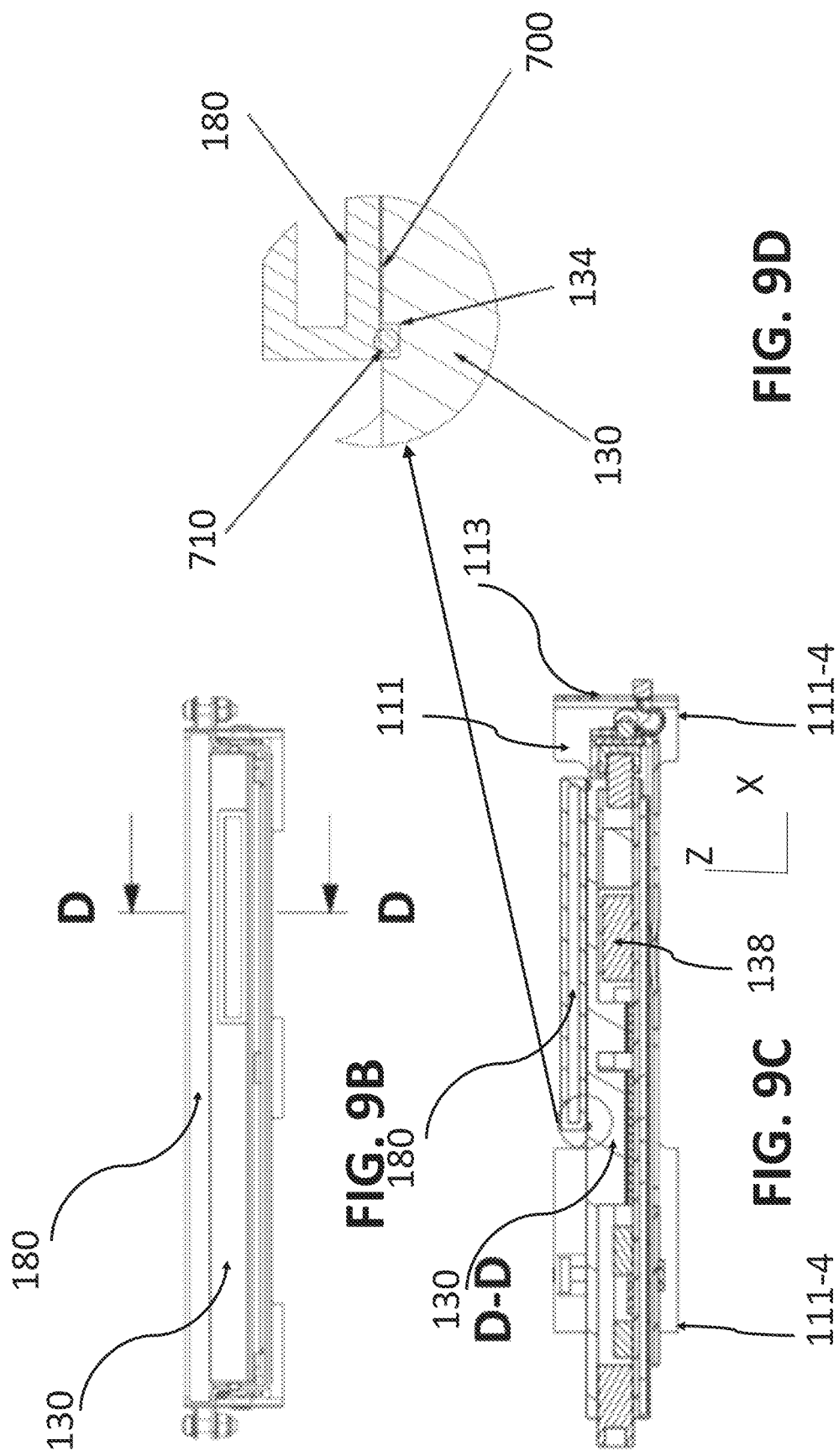

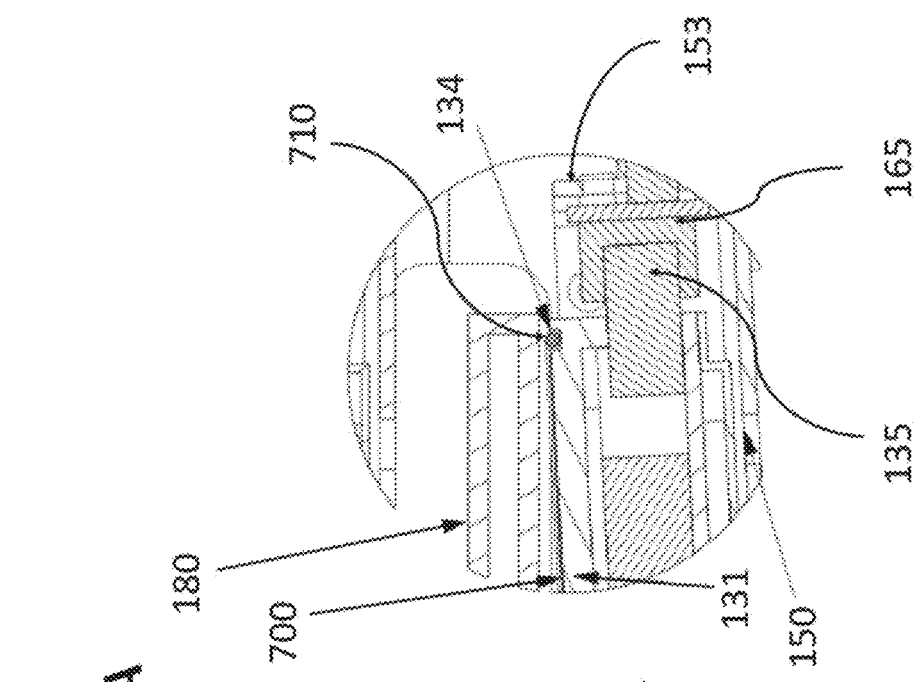
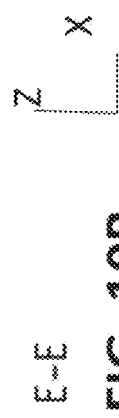

RACK WITH TRAYS FOR PLUG-IN AUTOMOTIVE CONTROL UNITS

CROSS-REFERENCE TO RELATED APPLICATION

This application claims the benefit of U.S. Provisional Patent Application No. 63/242,138, filed Sep. 9, 2021, which is incorporated by reference herein in its entirety.

BACKGROUND

In one current approach automotive electronic control units, ECU, are being replaced by more complex domain control units, DCU, or, increasingly frequently, multi-domain control units, MDC. Both type of control units or simply controllers are devices designed to support and control various functional domains of a vehicle, like advanced driver assistance systems, ADAS, or infotainment systems. The DCUs are typically less complex devices, developed to operate in a single domain, while MDCs control functionalities from more than one domain. A DCU/MDC controller of different functionalities can be replaced in a vehicle, simply by plugging-in and -out the device from a car, similarly as blades are replaced in a server rack. Such physical replacement of a control unit offers not only new/updated functions to the vehicle, but also new hardware capabilities, such as, increased computing power, by using more efficient logical components, increased system memory capacity, by replacing memory components, improved energy distribution system, by using newer generation of electronic components, and more. With the increased computing power, additional heat is generated from the controllers as a result of this increase which requires additional thermal management to account for the additional heat output. Plugging-in and -out the device from a car may exposed the device to damage when being plugged-in and -out. Accordingly, there is a need to address the above issues and problems with current replacement electronic control units, ECU, with domain control units, DCU, or multi-domain control units, MDC and to provide an alternative and improved rack assembly having an improved mounting arrangement for mounting trays for plug-in automotive type control units that addresses the problems with previous set-ups.

SUMMARY

The present application relates in general to a rack assembly for mounting of control units into a vehicle system. The rack assembly provides an improved mounting arrangement for mounting trays for plug-in automotive type control units.

The specification aims to provides an improved arrangement for coupling control units to a vehicle system, according to the embodiments described and claimed in the attached claims. According to a first aspect, there is provided a rack assembly unit for mounting a control unit to a vehicle rack system, the rack assembly comprising: a rack chassis; a tray for receiving the control unit; wherein the tray being movably coupled to the rack chassis at a coupling mechanism, the coupling mechanism configured to provide for movement of the tray relative to the rack chassis between a first open position and a second closed position; wherein at the first open position, the tray is spaced apart from rack chassis to facilitate user access to the tray and to the control unit receivable therein, and at the second closed position, the tray is located fully inserted relative to the rack chassis and such that the control unit located in the tray is provided at a control unit operating position thermally coupled to a cold plate of a cooling system to provide for cooling of components of the control unit.

The arrangement of the rack assembly unit advantageously provides for ease of location of a control unit in the vehicle system while also avoiding any unwanted forces on the components. The rack assembly unit is configured such that at the first open position, the tray is located at a lower position in the vertical direction relative to the rack chassis and a clearance space is provided between the control unit located in the tray and a cold plate located on the rack chassis. The cold plate is coupled to a cooling system. At the second closed position, the tray is located at an upper position relative to the rack chassis and the control unit and the cold plate are thermally coupled. The arrangement provides that a heat transfer surface of the control unit is positively engaged with a heat transfer surface of the cold plate to define a thermal interface, which supports cooling of electronic components located in the control unit. The rack chassis and tray coupled together to define a housing and support for the control unit. In one arrangement, the rack chassis comprises first and second side walls connected by a rear wall and having a front opening; the tray comprising first and second side walls connected by a rear wall and having a front opening and a base portion. The tray is movably coupled to the rack chassis such that it is located within the rack chassis in the upper closed position and movable relative to the rack chassis to the lower open position.

In one arrangement the rack assembly unit further comprises a fixing mechanism for fixing the tray in the closed position, the fixing mechanism and rack assembly configured such that when tray is fixed in the closed position at the fixing mechanism, the control unit is located in contact with the cold plate to define a thermal interface therebetween, and a controlled contact force is applied between the control unit and the cold plate.

The rack assembly is configured to provide for generation of a contact force at a thermal interface between the control unit and the cold plate when the fixing mechanism is engaged. The rack assembly unit is essentially configured to provide for the controlled application of forces between the control unit and components including the tray, chassis, and cold plate, including by virtue of the arrangement of the fixing mechanism. As the fixing mechanism is engaged, a controlled force is applied between the control unit and cold plate. The controlled force arising from the interaction of the fixing mechanism with the components of the rack assembly.

According to one arrangement, the control unit when located at the at the control unit operating position is further electrically and/or communicatively coupled via the rack assembly with the vehicle system.

According to another arrangement, the control unit has at least one connector comprising an electrical and/or communication connector and the rack assembly unit comprising a corresponding header and a backplane connector for coupling the control unit to the backplane board.

In one arrangement, the connector of the control unit may comprise a plug-in connector receivable at the header of the tray when the control unit is inserted into the tray. From that single connection to the header, the control unit is further directly coupled to the backplane board of the vehicle system. This electrical and communicative coupling is provided via the header and a backplane connector. Taking account of the corresponding features and form of the tray and control unit—the insertion of the control unit is done as a simple plug-in insertion. Effectively the rack assembly unit can be considered as acting as an adaptor between the control unit and the vehicle system. The control unit is directly coupled to the backplane board via the rack assembly unit.

In one arrangement, the rack chassis comprises a cold plate support for receiving and supporting a cold plate, and the rack assembly unit configured such that when the tray is located in the lower open position, the control unit located in the tray does is spaced apart from the cold plate, and when the tray is located in the upper closed position the control unit in the tray is located such that a heat transfer surface of the control unit is thermally coupled to a heat transfer surface of the cold plate to form a thermal interface therebetween.

In one arrangement, the cold plate receiver is configured such that a cold plate is supported at an upper portion of the rack assembly relative to the tray and the control unit. The arrangement and features of the rack chassis, tray, and control unit are optimized and configured such that when the rack assembly unit is fixed in the upper closed position, the resulting interactions and forces between the rack chassis, tray, and the control unit result in the provision of a controlled force at the interface between the control unit and the cold plate. Advantageously, this engagement of the cold plate and control unit defines a thermal interface between them at which the two components are thermally coupled. Heat transfer from the control unit to the cold plate. The controlled force provided results in a positive engagement and coupling of the cold plate to the control unit at the thermal interface and across the area of overlap of each of the components. The occurrence of air gaps, for example, is reduced by the application of the force. Further a consistent force is maintained across the thermal interface and thus a consistent coupling. As noted from the description and the drawing the thermal interface is formed between that portion of the control unit at which the electronic components that require cooling are located.

In one arrangement, the rack chassis has first and second side walls, wherein the cold plate support is defined by first and second recesses formed at a top edge surface of each of the side walls, wherein the recesses of the support are located opposite to each other, such that in use the cold plate is arranged extending between the first and second recesses and over a portion of the control unit located in tray.

In one arrangement, when the control unit is located in the operating position a thermal interface material, TIM, is provided between the control unit and the cold plate such that a heat transfer surface of the control unit and a heat transfer surface of the cold plate are thermally coupled via said TIM.

Advantageously, the provision of a TIM layer further promotes heat transfer at the thermal interface and provides for improved thermal coupling.

In one arrangement, the control unit comprises a housing which comprises a TIM receiver portion for receiving the TIM in the form of a TIM layer 701, wherein the TIM receiver portion may be defined by a recessed groove formed in an upper surface of the control unit, the recessed groove defining a periphery of the TIM receiver portion and having a shape generally corresponding to that of the cold plate, and wherein an O-ring is located in the recessed groove surrounding the TIM receiver portion.

Advantageously, the arrangement of the TIM receiver comprising a seal—provides together with the control unit and the cold plate for a leakproof TIM receiver at the interface between the cold plate and the control unit. As noted above when the control unit is thermally coupled to the cold plate, forces are exerted between the control unit and the cold plate, and the seal is engaged with a corresponding surface of each of the cold plate and the control unit housing. The TIM may further comprise a phase change TIM. The use of a phase change TIM is supported by the sealed arrangement.

In one arrangement, the coupling mechanism comprises a hinge mechanism, wherein the tray and rack chassis are coupled at a rear portion of the rack assembly by means of the hinge mechanism configured to provide for a rotational movement of the tray relative to the rack chassis.

In one arrangement, the tray and rack chassis are further coupled at the front portion of the rack assembly by means of a stop mechanism configured to define and to limit the angular range of movement of the tray relative to the rack chassis between the lower open position of the tray and the upper closed position of the tray.

In one arrangement, the stop mechanism comprising fixing brackets on either side of the tray are receivable in the corresponding fixing bracket receiver slots of the rack chassis, the range of movement of the fixing bracket in the slot defining the range of angular movement of the tray about the tilting axis and relative to the rack chassis, each fixing bracket being moveable in a generally vertical direction (Z) between a lower open position and an upper closed position thereof within the slot. In the open position the front of the tray is located at a distance Z3 relative to the upper edge surfaces of the side walls of the chassis and the tray being tilted about the tilting axis at a rear portion thereof such that the control unit located in the tray is spaced apart relative to the cold plate across the entire surface area thereof. Further in one arrangement, each slot has a generally rectangular form having upper and lower edge surfaces, wherein the fixing bracket is moveable between said upper and lower edges surfaces of the slot, the lower end defining a stop at the maximum angle of tilting of the tray about the tilting axis and the upper edge thereof defining a stop at the closed position of the tray.

Advantageously, the arrangements of the specification provide that when the tray is in the opened position the arrangement of the rack assembly unit and control unit is such that there is a clearance or separation between the control unit and the cold plate. While the control unit is tilted relative to the cold plate and to the rack chassis, the front portion of the control unit is at a greater separation from the rack chassis or cold plate, that the back portion is. However, the components are arranged to provide a clearance space across the upper surface area of the control unit. This avoids unwanted forces acting on the control unit or the cold plate and allows ease of access.

Further, as the tray is moved to the closed position, the control unit is moved into contact with the cold plate such that a contact force is applied between the control unit and the cold plate. The force applied arises from the interactions between the rack chassis and tray and the control unit and cold plate including as the tray is moved to the closed position and when the fixing mechanism is engaged.

In one arrangement the rack assembly unit further comprises a hinge rotation stop defined by a hinge stop slot formed in the rear wall portion of the rack chassis and a hinge stop protrusion attached to the tray and receivable in the hinge stop slot, the hinge rotation stop configured such that when the tray is tilted to the open position relative to the rack chassis, the hinge stop protrusion is engaged with an upper edge surface of hinge stop slot and further tilting of the tray relative to the rack chassis is limited.

In one arrangement, the coupling mechanism comprises a guided pin fixing mechanism, wherein the tray and rack chassis are movably coupled at the first and second side walls by the guided pin fixing mechanism to provide for movement by translation of the tray relative to the rack chassis between the first open position and the closed position; and wherein the tray and rack chassis comprise corresponding guide pins and guide slots located at the first and second side walls of each of the tray and rack chassis.

In one arrangement, the movement of the tray relative to the rack chassis is controlled by the range of movement of the each of the guide pins in each of the corresponding slots as defined by the guide slots, wherein the range of movement provides for translation of the tray relative to the rack chassis in the horizontal (X) and vertical (Z) directions.

In one arrangement, the rack assembly unit of any preceding claim wherein tray further comprises a bead located on an inner surface of the base the tray and configured to generate a controlled contact force between the tray and the control unit located therein.

In one arrangement the rack assembly unit wherein the fixing mechanism for fixing the rack assembly in the closed position is defined by corresponding features of the rack chassis and the tray or control unit; the rack chassis comprising one or more fixing brackets; and the tray or the control unit coupled to the tray comprising one or more corresponding fixing brackets; wherein a fixing screw is engaged a corresponding fixing brackets of each of the rack chassis, and the tray or control unit, to fix the position of the tray relative to the rack chassis in the closed position.

In one arrangement, the rack assembly unit comprises: first and second fixing brackets located on each of the side walls of the rack chassis and corresponding third and fourth fixing brackets located on each of the side walls of the tray, wherein in the closed position, the corresponding fixing brackets of the rack chassis and tray are located in proximity to each other and configured to receive a fixing screw to fix the rack chassis to the tray in the closed position.

In another arrangement a first fixing bracket is provided on the rack chassis extending between the first and second side walls of the rack chassis which is configured for coupling with a second fixing bracket that is provided on the control unit housing. In one arrangement the control unit housing comprises first and second fixing pins located projecting outwardly relative to the first and second side walls at a front portion thereof and configured to engage with a corresponding control unit coupling slot located on the first and second sides walls of the tray.

According to a further aspect there is provided a vehicle rack server system comprising; a rack support for receiving at least one rack assembly unit as claimed in any preceding claim; a backplane board comprising one or more backplane connectors for interfacing with said control unit; a cold plate coupled to a cooling system, the cold plate located in the rack support and receivable on said rack assembly unit; the rack server system further comprising: a rack assembly unit located in the housing for mounting a control unit to the vehicle rack server system, the rack assembly unit comprising one or more headers and connectors coupled to the backplane board, and the cold plate located on the rack assembly unit; a control unit located in said rack assembly unit; wherein the rack assembly unit is configured such that when the control unit is located at an operating position therein, the control unit is directly thermally coupled to the cold plate to provide heat transfer from the control unit to the cold plate.

The vehicle rack server system may further comprise two or more rack assembly units arranged in a stack in the housing for mounting a plurality of control units therein.

In one arrangement, the control unit comprises one or more electrical or communication connectors and a TIM layer located on a housing thereof; wherein the rack assembly unit is configured such that when the control unit is located at an operating position therein, the control unit is directly thermally coupled to the cold plate at the TIM layer to provide heat transfer from the control unit to the cold plate, and the control unit is directly electrically and/or communicatively coupled to backplane board via corresponding headers and connectors of the rack assembly unit.

The arrangement of the vehicle server system addresses problems associated with previous approaches and allows for a correct and relatively simplified access and coupling of a control unit to the vehicle system, by virtue of the combination of features. The arrangement also provides for improved cooling and a cooling arrangement that provides an improved thermal coupling for heat transfer. The provision of a TIM layer further promotes efficient and effective cooling.

BRIEF DESCRIPTION OF THE DRAWINGS

FIGS. 2A, 2B, 2C and 2D provide different views of an exemplary arrangement according to the specification with a control unit located in a rack assembly unit; FIG. 2A shows a perspective view of a rack assembly unit comprising a tilting tray coupling mechanism according to an exemplary arrangement, and depicts some main components of the rack assembly unit; and 2B shows a top down view of the arrangement of FIG. 2A; FIG. 2C provides a front plan view and FIG. 2D provides a side view.

FIGS. 3A to 3D show an exemplary rack assembly unit and the rack chassis and the tray which are coupled together to form the rack assembly unit at a coupling mechanism in this case a hinge mechanism; FIGS. 3A and 3B each show the rack-tray assembly in a fixed closed position;

FIGS. 3C and 3D present perspective views of the rack chassis and the tray separately.

FIGS. 4A to 4D depict the consecutive steps of the control unit assembly process for the tray-tilting mechanism. FIG. 4A depicts the hinge tray mechanism in an opened state in a perspective general view with the tray opened, ready for insertion of the control unit housing; FIG. 4B depicts a side plan view of the hinge tray mechanism with an enlarged view of the slot and guide member and fixing mechanism; FIG. 4C shows a plan view from the rear of the rack assembly unit and an enlarged view of the headers of the tray. FIG. 4D shows a partially cut-away view of the hinge plate and hinge stop arrangements.

FIGS. 5A to 5E show a general view of the rack segment or rack assembly unit of an arrangement of the specification, equipped with a guided-pin coupling mechanism; FIGS. 5A and 5B show perspective views of the guided pin mechanism, with the tray closed, ready for insertion of the control unit housing; subfigures 5C and 5D each show the rack chassis with and without the side wall cover; 5E shows the tray with the guide pins attached to the side walls by means of guide pin plates.

FIG. 6A shows a perspective view of the opened tray in the rack having side cover panels in place.

Example mountings of the control unit into the rack are shown in FIGS. 6A to 6C and FIGS. 7A to 7C. FIGS. 7A to 7C shows the consecutive steps of insertion of a control unit into the rack equipped with the tray-tilting mechanism; FIG. 7A provides a perspective view of the control unit engaged with the tray; FIG. 7B provides a cross-sectional view of the tray and the control unit there at the tilt position relative to the cold plate; FIG. 7C shows a similar view with the tray in the closed position;

FIGS. 8A to 8D illustrate the mounting of a control unit in the rack equipped with guided-pin mechanism. FIG. 8A illustrates a perspective view of the control unit in the rack with an enlarged view depicting insertion of the control unit guiding pins into the cut-outs in the tray in an opened position. FIG. 8B illustrates the tray loaded with a control unit pushed into the rack, following the guiding cut-outs in the rack with enlarged views showing the tray pins pushed along the rack guiding cut-outs until the final closed position. FIG. 8C illustrates a front view of the tray loaded with a control unit fixed in its final position, C-C illustrates the cross-section line through the tray loaded with the control unit fixed in its final position and FIG. 8D illustrates the cross-section of the tray loaded with the control unit fixed in its final position and showing a thermal interface established between the control unit and cold plate.

FIGS. 9B and 9C provides front plan view and a cross-sectional view along the line D-D respectively; FIG. 9D shows a detail of the interface between the cold plate and the control unit housing including a seal and a TIM layer.

FIGS. 10A to 10C provide further view of the stack of three rack assembly units of FIG. 1B; the position of the middle tray is shown in the tilted open position relative to the chassis; FIG. 10A provides a front plan view of the arrangement of FIG. 1B; FIG. 10B provides a cross-sectional view which shows the positions of each of the control units and trays relative to the rack chassis; FIG. 10C shows an enlarged view of the control unit located in the tray is in the open position, showing that the TIM layer and seal are not in contact with the cold plate.

DETAILED DESCRIPTION

Figure 1A:
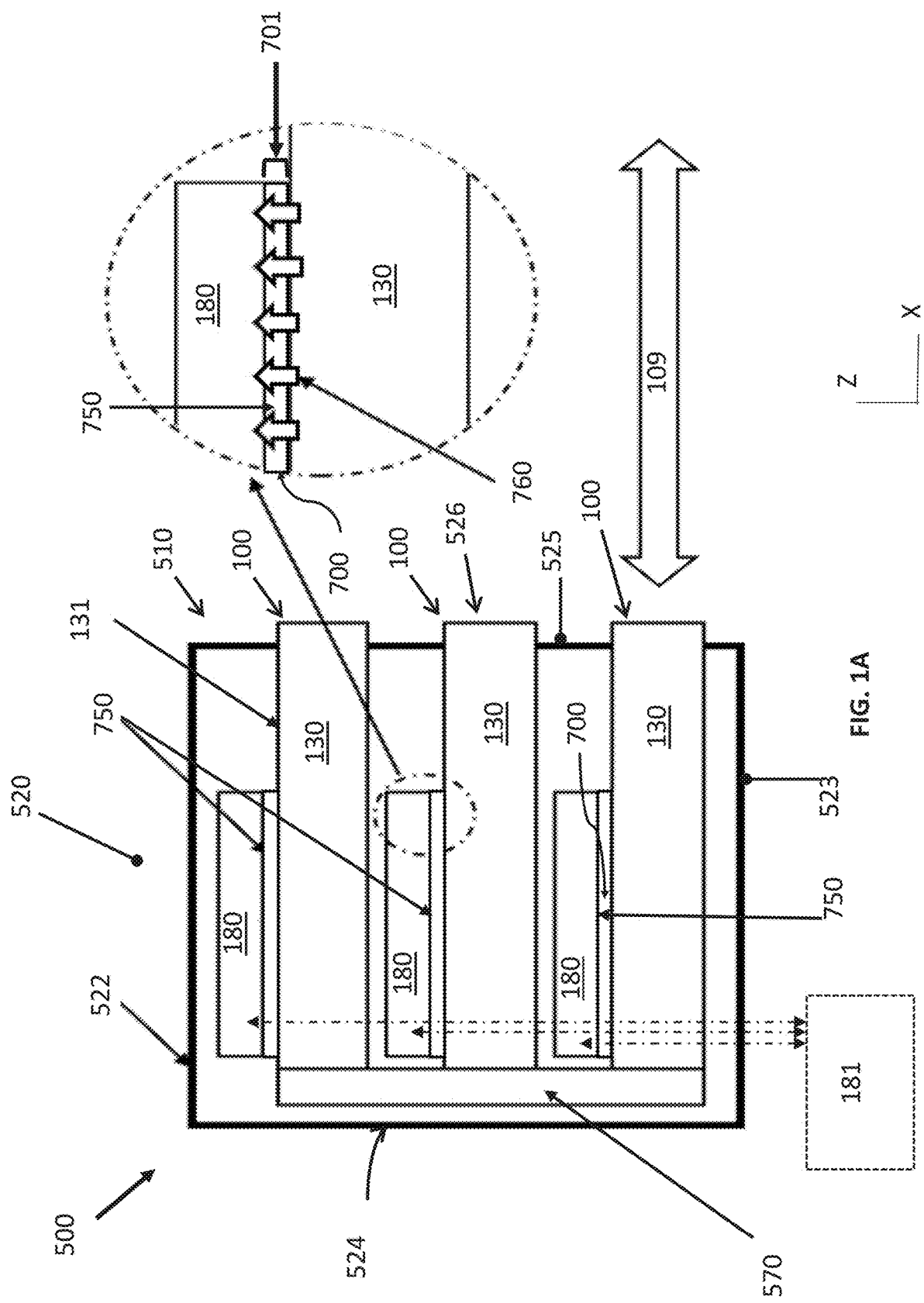
FIG. 1A provides a schematic view of a vehicle server system 500 having including a schematic representation of the automotive rack server equipped with a cold plate and electronic control units; In the schematic representation, a heat flow path between these components is marked by arrows, the control units are located in a stack of rack assembly units each supporting a control unit for mounting the control unit within the vehicle and coupled as required to the vehicle system and a cooling system, according to an exemplary arrangement of the specification.

In an example, a control unit 130 is mounted in a tray 150, and subsequently the tray is mounted in a rack. Trays are equipped with fixing mechanisms also referred to herein as coupling mechanism enabling the trays to fix or couple their position in the rack, and headers 135 to transmit signals from the control unit 130s in the trays to a backplane board 570. The main components of the vehicle rack server system of FIG. 1A and the rack assembly unit in FIG. 2D and in the other Figures are a rack chassis, a control unit, a tray, a fixing screw, backplane connectors, and cold plate.

The specification provides different exemplary arrangements including a rack assembly having alternative two blade fixing also referred to as two blade coupling mechanisms. The first coupling mechanism described provides a tilting tray mechanism. The second provides a guide coupling mechanism, an arrangement in which trays are guided by cut-outs or slots provided in a rack chassis. The rack assembly units of the specification advantageously provide a leakproof enclosure for a phase change thermal interface material (TIM) between the control unit housing and cold plate, and for control and generation of a contact force in the thermal interface, between the control unit housing and the cold plate.

In the specification the term design has been used to reference to the exemplary arrangement and alternative exemplary arrangement. A first tray-tilting design or coupling mechanism—is based on a hinge mechanism, allowing the tray to tilt in the rack by a predefined angle, necessary for insertion/extraction of a control unit. In some alternative examples, the coupling mechanism is a guide-based coupling mechanism providing a rack equipped with cut-outs/guides formed in portions of the rack walls, which are configured as guides for movement of a tray, enabling safe replacement of a control unit mounted on the tray.

With reference to the exemplary arrangements of the drawings, the present specification provides a rack assembly unit 100, 300 comprising a rack chassis 110 and tray 150 arranged for supporting a control unit 130 for mounting to a vehicle system. The rack chassis 110 and tray 150 configured for movably coupling together to form the rack assembly unit 100, 300. In the specification the rack assembly has also been referred to as the rack and tray unit, rack assembly unit and rack segment. Each rack assembly unit 100, 300 according to the specification is configured for mounting a control unit 130 within a vehicle. The vehicle comprises a vehicle server system 500 at which the control units are mounted to the vehicle, having a housing for receiving the control units, connectors for interfacing the control units, as required to the overall vehicle system, and coupled to a cooling system. The vehicle system includes the internal communications and electrical system of the vehicle.

The control units 130 may comprise plug-in automotive control units including, for example DCUs, ECUs or MDCs. In the arrangements of the specification the rack assembly unit 100 is in configured for mounting automotive control units 130 to a vehicle by connection at the vehicle rack server system t00.

An exemplary arrangement of the vehicle rack server system 500 is described with reference to FIGS. 1A and 1B. In the arrangement of FIG. 1A, the vehicle rack server system 500 includes three control units 130 mounted in a stacked configuration at rack support 510. The rack support 510 is configured to receive one or more control units mounted in one or more rack assembly units 100, 300. The vehicle rack server system 500 further comprises a backplane 570 configured to interface the control units 130 with the vehicle systems. The backplane 570 comprises backplane connectors 575. Each control unit 130, when mounted in its respective in use operating position, within the vehicle rack server system 500 is directly coupled to the backplane 570. The coupling of the control unit 130 to the backplane 570 provides for an electrical and/or communicative coupling of the control unit 130 to the backplane 570 and to external vehicle systems. In addition, each control unit when mounted in the operating position is thermally coupled to a cooling system. The rack assembly unit 100, 300 is configured to provide for a thermal coupling of the control unit located therein to a cold plate 180 of a cooling system 181, to support a heat transfer between components of the control unit 130 and the cold plate 180 at a thermal interface 750. A thermal interface material, TIM, 700 is provided between the control unit 130 and the cold plate 180. In this configuration, the TIM 700 is provided in a layer 701 located between the control unit 130 and the cold plate 180 such that a heat transfer surface of the cold plate 180 is thermally coupled to a heat transfer surface of the cold plate via the TIM. The rack assembly unit comprises a cold plate receiver for supporting the cold plate as required for coupling to a corresponding control unit 130. This is described in further detail below.

The rack support 510 generally defines a housing unit 520 in which the one or more control units 130 are locatable, each control unit is mountable in a separate rack and tray unit 100 therein. The housing 520 comprises upper 522 and base 523 portions, rear 524 and side portions and a front 526 portion which defines an opening. Access to the one or more rack assembly units 100, 300 and to trays or the control units is provided at the front portion 526. The rack support 510 is arranged such that each rack assembly unit 100 and the control unit 130 mounted therein is oriented generally in a horizontal X-Y plane. The front and rear portions of the housing unit 520 are oriented generally vertically in a Z-Y plane. As such, in an arrangement comprising two or more control units, the control units 130 are effectively arranged in a vertical stack within the housing unit 520. In the exemplary arrangement of FIG. 1A the backplane 570 is located generally adjacent to the rear 523 portion of the housing unit 520 and between the rear portion 523 and the rack and tray units 100.

The rack and tray units or rack assembly units 100, 300 of the exemplary arrangements are advantageously configured to allow control of the location of the control unit 130 located in the tray 150 relative to the rack chassis 110 and accordingly relative to the cold plate 180 and the backplane 570 of the vehicle rack server system. Further the rack assembly unit 100, 300 is configured to provide control of forces between the control unit 130 and components including the tray 150, chassis 100 and cold plate 180. The rack assembly units 100, 300 are configured to support ease of user access to the tray 150 and control unit 130 including for example, to insert, adjust, or exchange a control unit. Each rack assembly 100 is configured for stacking with other rack assembly units 100 to provide a modular type stacked rack assembly 100'. The stacked rack assembly 100' of FIG. 1B is configured to be receivable in a vehicle rack server system 500.

Referring to FIGS. 2a to 2d, a rack assembly 100 according to a first exemplary arrangement is described. In FIGS. 2, a control unit 130 is located in the rack assembly unit and the rack assembly unit is shown in a closed state.

The rack assembly unit 100 comprises a rack chassis 111 for receiving a corresponding tray 150. the tray 150 is moveable relative to the chassis 111 between a first open position where the tray is spaced apart from the rack cassis arranged to allow access e.g., for insertion of a control unit 130 into the tray 150, and a second closed position where the tray is located fully inserted into the rack chassis, and at which the control unit 130 located in the tray 150 is at the control unit operating position within the rack assembly 100. As shown, the cold plate 180 is located on the rack assembly 100 at a support or receiver 120. The rack assembly unit and control unit are configured such that in use in the operating position, the control unit 130 is thermally coupled to the cold plate 180. In addition, when located in the operating position, the control unit 130 is coupled to backplane board 570 via the rack assembly 100. The control unit is accordingly electrically and communicatively coupled to the vehicle system.

The tray 150 comprises a front slot 159 for engaging with corresponding mating features of the control unit to assist in locating the control unit 130 in the tray. In the drawings the front slot comprises a tapered opening at the front facing end of the side walls and the slot extends in the x-direction generally horizontally along a portion of the side walls (for example having a length of the order of 10 to 20 mm) of the tray.

The control unit comprises connectors 135-1, 135-2 which are connected via headers 165-1, 165-2 of tray 150. Headers 165 are connected by means of a flat flexible cable, FFC, and connector 166 to backplane connectors 575-1, 575-2 of the backplane 570. The connectors 135 are located to the rear facing side of the control unit for connection to the headers 165 at a rear wall 153 of the tray. The tray comprises apertures 156 formed in the rear wall 153 to accommodate the headers 165 and connectors 166. The rack chassis 110 comprises cut-outs or apertures 116 aligned with the headers 165 when the tray is coupled to the rack chassis. When the tray is inserted into the rack chassis, the headers 165 provides the necessary connections in the direction of the backplane 570. The rack chassis has a width (the distance between the side walls) w1 greater than the width w2 of the tray. The rack chassis has a depth (of the side walls) d1 greater than the depth d2 of the side walls of the tray, and the depth d3 of the control unit.

The depth of each the rack chassis defined by the depth of the walls thereof, is sufficient to accommodate the tilting of the trays relative to the rack chassis in open position and to provide that a tilted tray 150 does not contact or result in application of force to a cooling unit located on a rack assembly below it, reference is made to FIGS. 10B and 10C in which the middle tray 150 is shown tilted relative to the corresponding rack chassis as in FIG. 1B. FIG. 2D shows the clearance or separation distance as provided by the rack assembly between the control unit and the top edge portion of the rack assembly and the relative positions of the cold plate and control unit.

Referring to FIGS. 2c and 2d further plan views from the front and side are provided. These views illustrate the compact arrangements of the control unit 130 in the rack assembly 100 in the closed position at which the control unit 130 located between a base 155 of the tray and the cold plate 180 located on the rack chassis.

The rack assembly unit comprise a fixing mechanism comprising one or more fixing screws 220 and first and second fixing brackets 210, 265. Fixing screws 220 extend through a fixing bracket 265 of the rack chassis and a corresponding fixing bracket 210 of the tray, to provide a connection between them and to fix the rack assembly unit in the closed position. In the arrangements shown, first and second brackets are provided located at each side wall of the rack chassis and of the tray, and a screw is inserted into each set of fixing brackets. In use, when the rack assembly unit and control unit are located in the vehicle rack server system, the rack assembly unit is fixed in the closed position by the fixing screws.

The rack assembly unit further comprises a coupling mechanism for movably coupling the tray and the rack chassis. The coupling mechanism provides for the movement of the tray relative to the rack chassis and the assembly of the tray and rack chassis for form the unit. The coupling mechanism according to the exemplary arrangements of FIGS. 1B, 2A to 2D, 3A to 4D and 4A to 4D is a tilting tray coupling mechanism 200. The coupling mechanism 200 comprises corresponding hinge 205, hinge receiver 255, and rotation stop features 210, 260 provided on both the tray and the rack chassis. The tilting tray mechanism is described in further detail below with reference to FIGS. 3A to 3D and 4A to 4D.

Referring to FIGS. 3A to 3C the rack chassis 110 comprises sides walls 111, 112 connected by a rear wall 113. The side walls and rear wall comprise inwardly facing surfaces 111-1, 112-1, 113-1 and outwardly facing surfaces 111-2, 112-2, 113-2, and a front opening 114. The side and rear walls have upper edge surfaces 111-3, 112-3, 113-3 and lower edge surfaces 111-4, 112-4, 113-4. The side walls have front facing edge surface 111-5, 112-5 and rear facing edge surfaces 111-6, 112-6. In use the front portion of the rack assembly unit faces outwardly and is the side at which a user can access the tray and control unit. The rear facing side faces the backplane. Portions of the side and rear walls as shown in the drawings include cut-outs forming apertures 156, 157 or openings 116, the external surfaces of the walls of the rack chassis may define the external surfaces of the rack assembly unit 100. In an alternative arrangement a cover panel may be applied to the external surfaces of the side and/or rear walls.

The rear wall 113 includes cut-out portions which define connector cut-outs or connector openings 116 to accommodate headers 165 of the tray 150. In use, the headers 165 protrude through the connector openings 116 of the rack chassis for connection to a backplane 570. Each side wall 111, 112 comprises a recess 120 having a lower edge surface 121 which is recessed relative to the upper edge surfaces 111-3, 112-3. In use, the two recesses 120 arranged at opposite side walls 111, 112 together define a cold plate receiver of the rack chassis, As shown in FIG. 2A, in use cold plate 180 is supported by the rack chassis. The recesses 120 have a depth d4, corresponding to the distance from the upper edge surfaces 111-3, 112-3 of the side walls 111, 112 to the lower edge surface 121 of the recess 120, which is greater than the depth of the cold plate. Noting that a number of rack assembly units 100 or 300 may be provided arranged in a stack, recess 122 is provided at a lower side edge of each of the side walls at a location corresponding to the recess 120, such that in a stacked configuration, the lower edge surface of second rack assembly stacked above a first rack assembly is spaced apart from the cold plate 180. The rack assembly unit is configured to accommodate the cold plate and to avoid unwanted forces acting thereon and to allow access.

The tray 150 is movably coupled to the rack chassis 110 of the rack assembly 100, each comprises corresponding mating features of the hinge coupling mechanism 200. FIGS. 2A to 2D and 3A and 3B show the tray coupled to the rack chassis.

As shown most clearly in FIG. 3C, the rack chassis 110 comprises hinge receivers 255 comprising circular apertures located at to the rear-end portion of each of the side walls configured for mating with corresponding hinges 205. The rack chassis comprises slots 260 and a fixing bracket 265 located at the front-end portion of each of the side walls which are configured for mating with corresponding fixing brackets 210 of the tray 150.

Referring to FIG. 3D, the tray 150 comprises first and second side walls 151, 152, a rear wall 153, a base 155, and a front opening 154. The side walls and rear wall comprise inwardly facing surfaces 151-1, 152-1, 153-1 and outwardly facing surfaces 151-2, 152-2, 153-2. The side and rear walls have upper edge surfaces 151-3, 152-3, 153-3 and lower edge surfaces 151-4, 152-4, 153-4. The side walls have front end edge surfaces 151-5, 152-5 and rear-end edge surfaces 151-6, 152-6. In the exemplary arrangement the base 155 and rear wall 153 comprise cut-outs defining base apertures 157 and rear wall apertures 156. The base apertures 157 may be provided to reduce the overall weight of the tray. The rear wall apertures 156 are provided to accommodate the one or more headers 165 of the tray 150. The base 155 of the tray further comprises a bead 164. The bead defines a contact surface for contacting and engaging with the control unit.

With reference to FIGS. 3A to 3D and FIGS. 4A to 4D, the fixing mechanism, in this arrangement the tilting tray fixing mechanism 200 is described in further detail.

The tray comprises hinges 205 and fixing brackets 210 provided located on the side walls 151, 152. The hinges 205 are located to the rear of the side walls in the X direction and in use when coupled to the rack chassis at the hinge receiver, the hinge element 205 is located between the rear and side walls of the tray and the rear and side walls of the rack chassis. The hinges 205 are attached to each side wall at a hinge attachment plate 240 (FIG. 3C and FIG. 4D) which allows for location of hinge at a separation in the X-direction relative to the rear end edge surfaces 151-6 and 152-6 of the side walls 151, 152. The hinges 205 extend outwardly relative to the side walls in the Y direction to attach to the hinge receivers 255 of the rack chassis. The fixing brackets 210 are located to the front portion of the side wall also protrude outwardly relative to the wall surfaces in the direction of the rack chassis which is use is located externally to the tray.

The hinges 205 and hinge receivers 255 of the rack chassis are located and configured for correspondence and mating. The hinges 205 are receivable in hinge receivers 255 located in the side walls 111 and 112 of the rack chassis at each side. The hinges 205 are inserted into the hinge receivers 255 at both sides of the tray movably coupling the tray to the rack chassis and to define a tilting axis 201 of the tray relative to the rack chassis. The hinge 205 is located offset in the X-direction relative to the rear wall and rear edge surface of each side wall of the tray and the tilting axis if located between the rear wall of the tray and the rear wall of the rack chassis.

The tray 150 and rack chassis 110 are also coupled together near to the front portion of the rack assembly 100. The fixing brackets 210 of the tray and the corresponding slots 260 and fixing brackets 265 of the rack chassis, are located respectively to the front portions of the corresponding side walls of the tray and the rack chassis. The fixing brackets 210 of the tray are configured for coupling to the rack chassis at the corresponding slots 260 and fixing brackets 265 of the rack chassis.

Referring to FIGS. 4A, 4B, 4C and 4D the coupling mechanism 200 for coupling of the tray and rack chassis is described in further detail. The slot 260 of the exemplary arrangement comprises a rectangular form aperture having an upper edge surface 261 and lower edge surface 262, and the fixing bracket 210 of the tray receivable in the slot and is movable within the slot 260 between the upper and lower edge surfaces 261 and 262 thereof which provide stops to the range of the movement of the fixing bracket. The interaction of the fixing brackets 210 with the slots 260 also defines the range of tilting of the tray relative to the rear tilting axis. The fixing brackets 210 are moveable generally in the vertical direction (Z) relative to the slot. When the fixing bracket 210 of the tray is engaged with the lower surface 262 of the slot, the tray is in the open position and tilted at the maximum angle α of the tilting range of movement of tray relative to the rack chassis. In the exemplary arrangement of FIGS. 4A and 4B, the lower edge surface 262 of the slot is arranged sloping at an angle α to the horizontal (and the orientation of the upper and lower edge surfaces of the side walls), such that in the open position the fixing bracket 210 and the lower edge surface 262 are at substantially the same angle and the engagement surface of the fixing bracket is aligned for engagement with the lower edge surface 262.

Figure 4A:
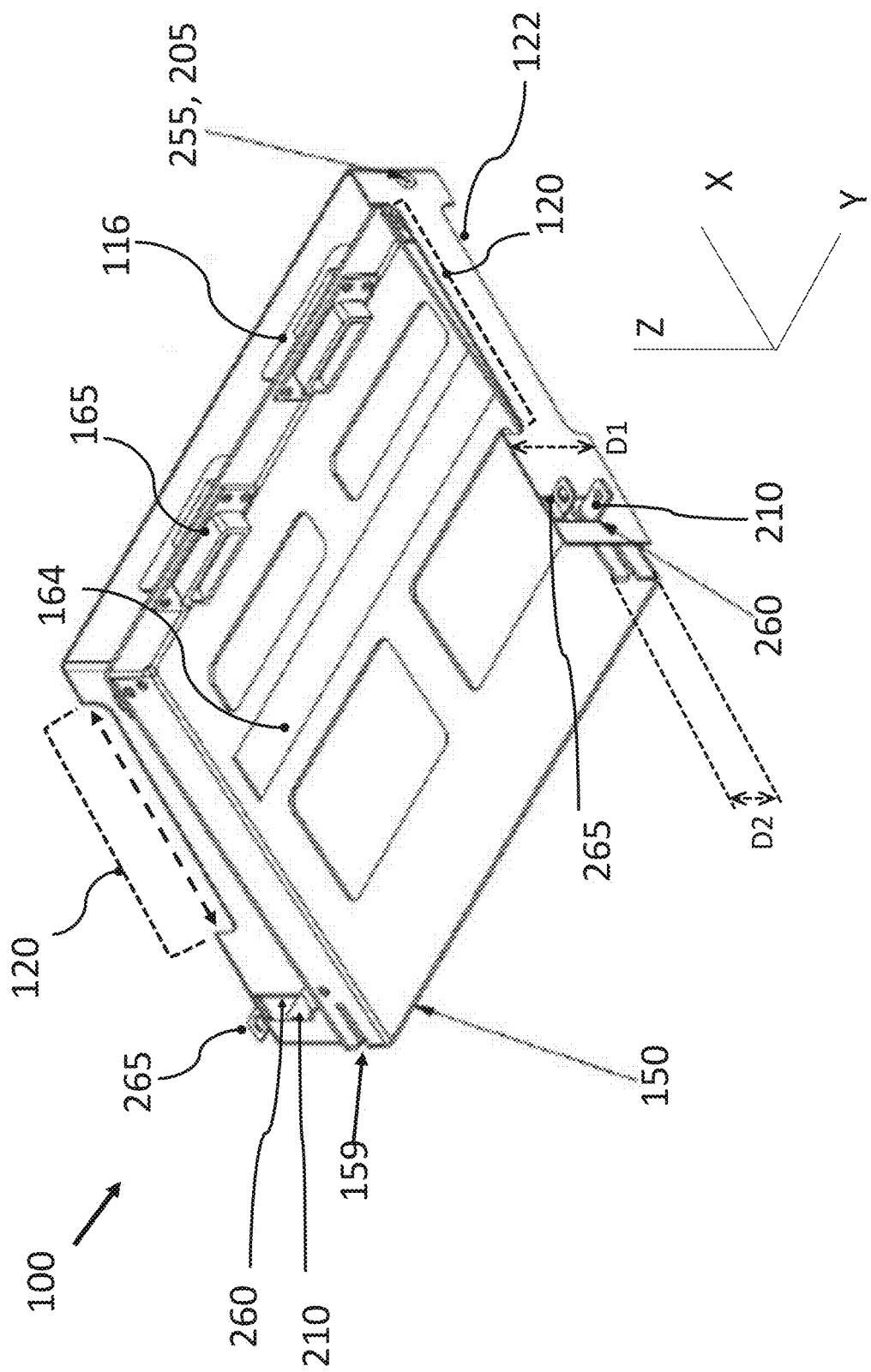
Figure 4B:
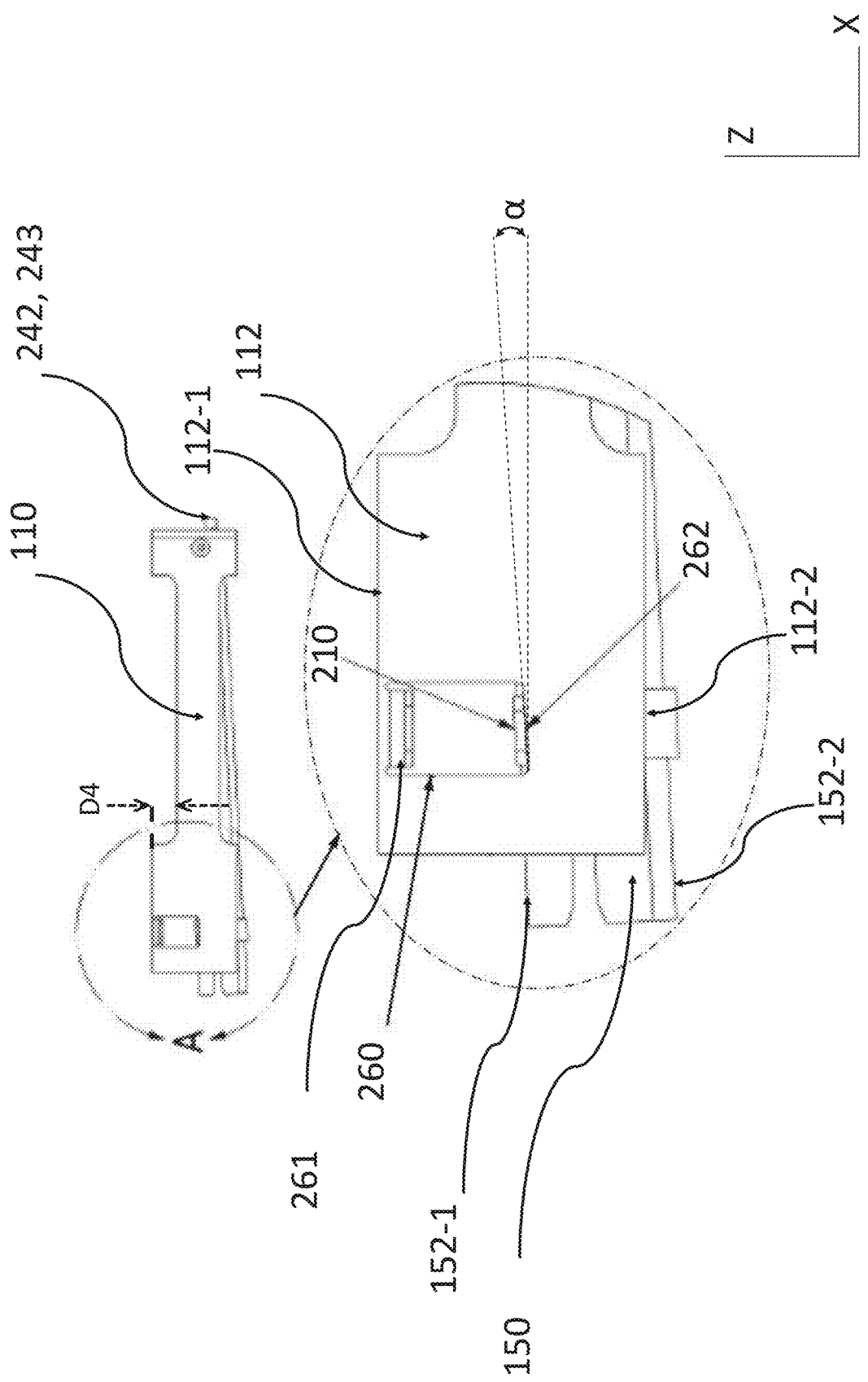

While in FIGS. 2A to 2D and FIGS. 3A and 3B the tray is shown in the closed position with the fixing pins or fixing screws 220 in place in the fixing brackets 265 and 210, in FIGS. 4A and 4B the tray is shown in the open position. The tray is spaced apart from the rack chassis such that a user can access the tray for inserting, replacing, or removing a control unit.

Referring to FIG. 4C, the location of the one or more headers 165 of the tray in the apertures 166 of the tray and extending through the connector openings 116 of the rack chassis. As noted above, the rack chassis is configured for provide clearance for movement of the tray relative to the chassis and the other rack assembly units of a stack. As shown in FIG. 4C the base of the tray, in the tilted position, is fully contained within the footprint of the rack chassis and the tilting does not affect the alignment of the header 165 of the tray relative to the aperture 116 of the rack chassis.

Figure 4D:
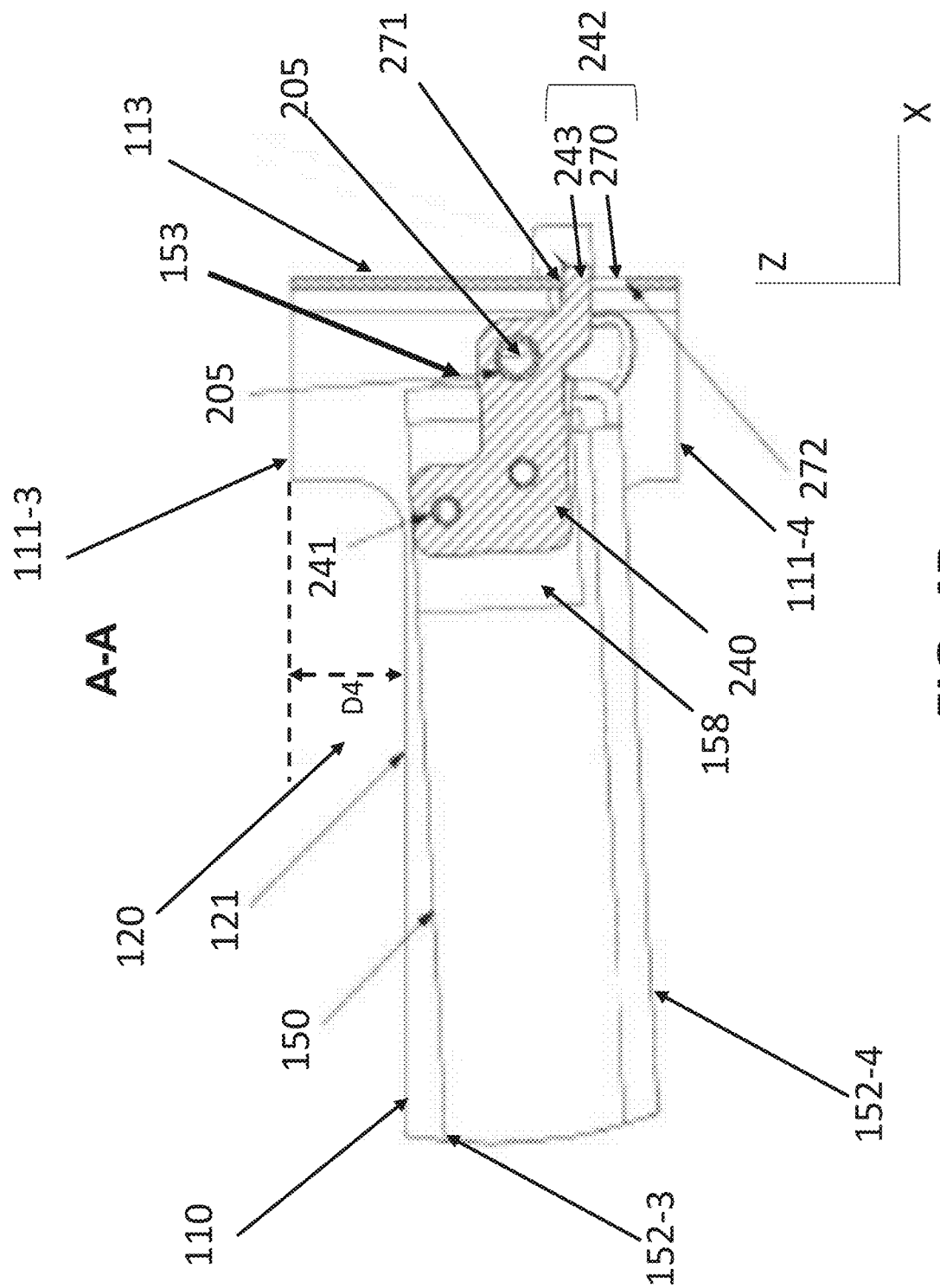

Referring to FIG. 4D, the hinge 205 is located on the tray by means of a hinge plate 240. The hinge plate 240 is attachable to an external surface of the side walls 151, 152 by fixing means 241.

The tray may comprise a recess 158 for receiving the plate 240. The plate is shaped and sized for attachment to the rear-end portion of each side wall—such that a portion of the plate overlaps a portion of the external surface of the side wall and a portion of the plate extends rearwardly relative to the side wall to locate the hinge 205 rearwardly of the tray. In use and when the tray is coupled to the rack chassis the hinge element and tilting axis are located between the rear wall of the tray and the rear wall of the rack chassis.

The rack assembly 100 may further comprise a hinge rotation stop 242 defined by corresponding hinge rotation stop features of the rack chassis and the tray. The rack chassis comprises at least one hinge stop slot 270, having an upper edge surface 271 and a lower edge surface 272, formed in the rear wall 113 thereof. The tray comprises a least one hinge stopper protrusion 243, arranged to protrude to the rear of the tray and receivable in the corresponding hinge stop slot 270. The hinge rotation stop 242 is configured such that when the tray is tilted to the open position relative to the rack chassis, the hinge stop protrusion 243 is engaged with the hinge stop slot 270 at the upper edge surface 271 and further tilting of the tray relative to the rack chassis is limited. The hinge stop 242 advantageously provides additional support and stability for the tray 150 in the open position and allows control of movement of the tray relative to the chassis.

In FIG. 4D the tray is in the open position and the hinge stop protrusion 243 is engagement with an upper edge of the slot 270. A hinge rotation stop 242 may be provided to one or both sides of the rack assembly. The hinge stop protrusion 243 may be provided, as shown in the exemplary arrangement of FIG. 4D, as part of the hinge plate 240. The hinge 205 and the hinge stop protrusion 243 are accordingly directly coupled at the plate 240. The tilting of the hinge controlled an arrangement which also allows control of forces between the components of the rack assembly units and components located or supported thereon.

Referring to FIGS. 5A to 5E and 6A to 6E a rack assembly unit 300 according to an alternative arrangement of the drawings is described. The overall arrangement of the rack assembly unit 300 is similar to that of the rack assembly 100 and many features of the tray and rack chassis correspond in each of the two arrangements. Similar reference numbers have been used where appropriate.

Referring to FIG. 5A, the rack assembly unit 300 comprises a tray 150 and rack chassis 110 which are movably coupled to form the rack assembly. The tray is configured to receive a control unit. The tray is moveable between an open position and a closed position. In the open position the tray is spaced apart from the rack chassis to allow access for inserting, removing, or replacing a control unit. In the closed position the tray is located received in the rack chassis. The rack assembly and the control unit are configured for correspondence, and such that when the tray is engaged in the closed position in the rack chassis, the control unit located in the tray is provided at the operating position of the control unit. At the operating position of the control unit, when the rack assembly is located in the vehicle server 500, then control unit is located for thermal coupling to a cold plate and further is coupled to a backplane connector of the server to provide an electrical and/communication connection. Connectors 135 of the control unit 130 are coupled via headers 135 of the tray to connectors 575 of the backplane. The tray 150 is movably coupled to the rack chassis 110.

Figure 5E:
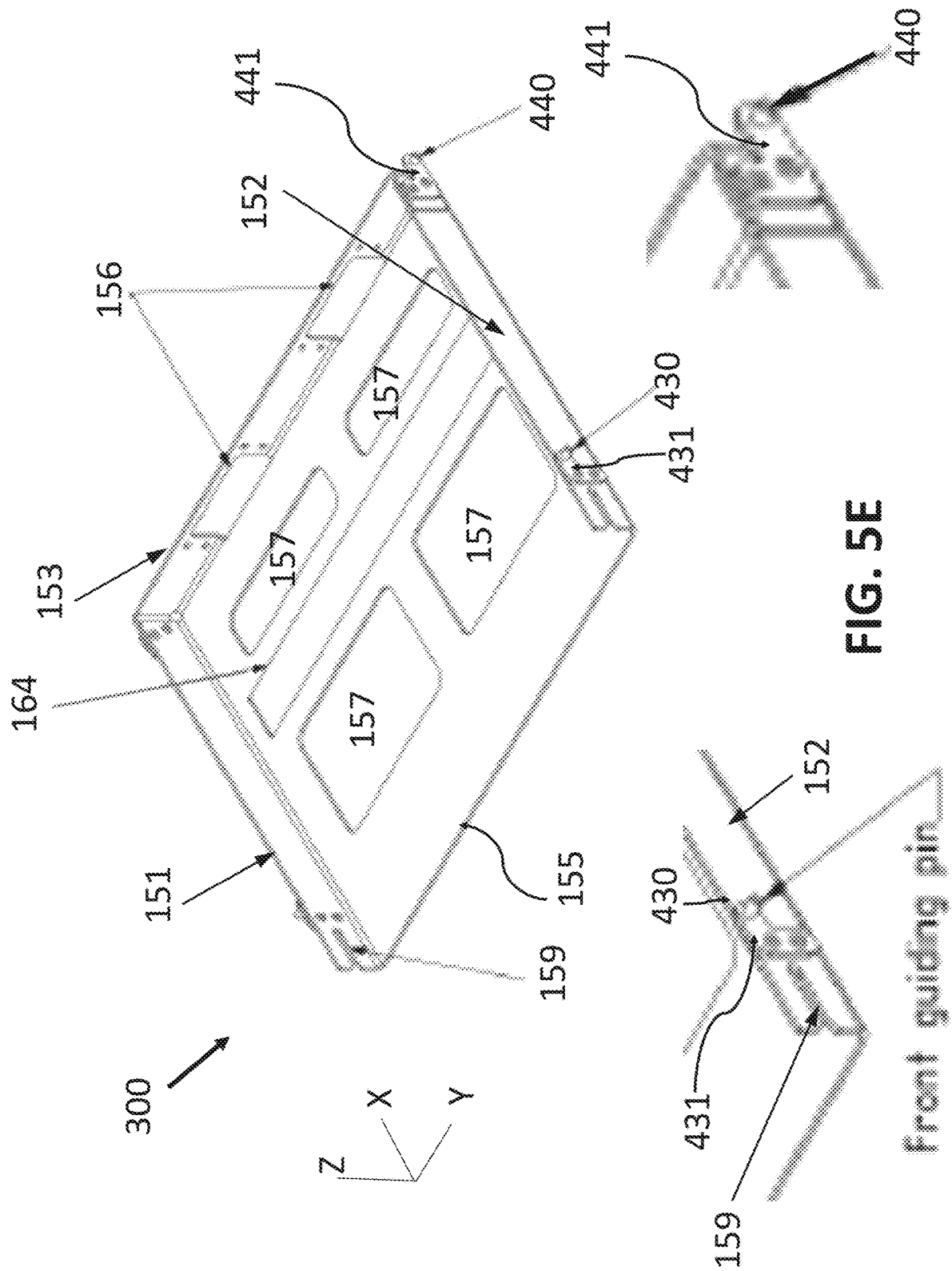

Referring to FIG. 5A, the tray is shown coupled to the rack chassis. The rack chassis comprises a controller fixing bracket 117 that extends in the Y direction between upper portions of the side walls 111, 112 of the rack chassis. The controller fixing bracket 117 comprises includes a controller fixing aperture 119. When the control unit is located in the tray in the closed position, the controller fixing bracket 117 is arranged in alignment with a control unit fixing bracket 137 comprising a fixing aperture 139 (see for example FIGS. 8A and 8C) and a fixing pin 221 is inserted through the apertures 119 and 139 to fix the rack assembly unit and control unit in the closed position. The rack chassis of the arrangement of FIGS. 5A to 5E further comprises a side wall cover 118. The side wall cover 118 is attachable to the external side walls 111, 112 and provides an external cover for the guide coupling mechanism. The side wall cover provides additional support at the side walls and protects the guide coupling mechanism.

The coupling mechanism 400 of the rack assembly 300 is different from the fixing mechanism 200 of the rack assembly 100 and is described in further detail with reference to FIGS. 5B to 5E. The rack assembly 300 comprises a coupling mechanism 400 which is based on a guide pin and guide slot arrangement which defines a guide coupling mechanism 400. The guide fixing mechanism 400 is configured to provide for movably coupling of a tray 150 to a rack chassis 110. In FIG. 5B, the tray is coupled to the rack chassis at guide and pin fixing mechanism 400. The guide fixing mechanism 400 comprises corresponding mating features of the tray and the rack chassis. As shown in FIGS. 5B and 5D, each side wall 111, 112 of the rack chassis comprises guide slots 410 and 420. As shown in FIG. 5E, each side wall 151, and 152 of the tray comprises guide pins 420 and 430 which are receivable in the guide slots 410. In the arrangement of FIG. 5, the tray is moved by translation, generally in the X direction relative to the rack chassis. The tray 150 remains oriented generally horizontally in the X-Y plane throughout the range of movement. The guide fixing mechanism is described in further detail below.

Referring to FIGS. 5C and 5D, the guide slots 410 and 420 are described in further detail. The first and second side walls, 111, 112 comprise an upper slot 410 and a lower slot 420. The slot 410 is formed in the wide wall extending in the X direction from an opening 411 in a front side edge of the wall in the direction of the rear of the tray. The slot 410 is of a length 11. The slot 410 is shorter in length than the slot 420—for example, having a length of around 0.1 to 0.2 of the overall length of the side wall. The slot 410 comprises a horizontal linear portion 412 and sloped portion 413. The slot is angled upwardly to the rear end portion 414 of the slot. The slot 410 is located above the slot 420 in the vertical (Z-direction). The slot 420 is of a length 12. The slot 420 is longer in length than the slot 410 and extends generally the length (X) direction of the side wall. The slot 420 comprises a horizontal linear portion 422 and sloped portion 423. The slot is angled upwardly at the sloped portion 423 to the rear end portion 424 of the slot. The slot 410 is located above the slot 420 in the vertical (Z-direction).

Referring to FIG. 5E each side wall 151, 152 of the tray comprises first 430 and second 440 guide pins receivable in the corresponding slots 410 and 420 of the rack chassis. The guide pins extend outwardly, generally at right angles to the external surfaces 151-2, 152-2 of each side wall. In the exemplary arrangement the guide pins have a cylindrical form and are dimensioned to be receivable in the corresponding guide slots. The guide pins 430, 440 are located on guide pin plates 431 and 441 which are attachable to the side walls by fixing pins or other suitable means. Each plate is clamped to at least a portion of external surface side wall of the tray such that the plate overlaps with a portion of the side wall. Guide pins 430 are located generally near the upper edge surfaces 111-3, 112-3, of the side walls and to the forward end of the tray. Guide pins 440 are located generally near the lower edge surface 111-4, 112-4 of the side walls and are located to the rear facing end of the tray. The tray is coupled to the rack chassis by inserting the guide pins 430 and 440 into the guide slots 410 and 420 respectively. In the arrangement shown, the rear guide pin 440 is located off-set in the X-direct relative to the rear wall 153 of the tray.

Figure 6A:
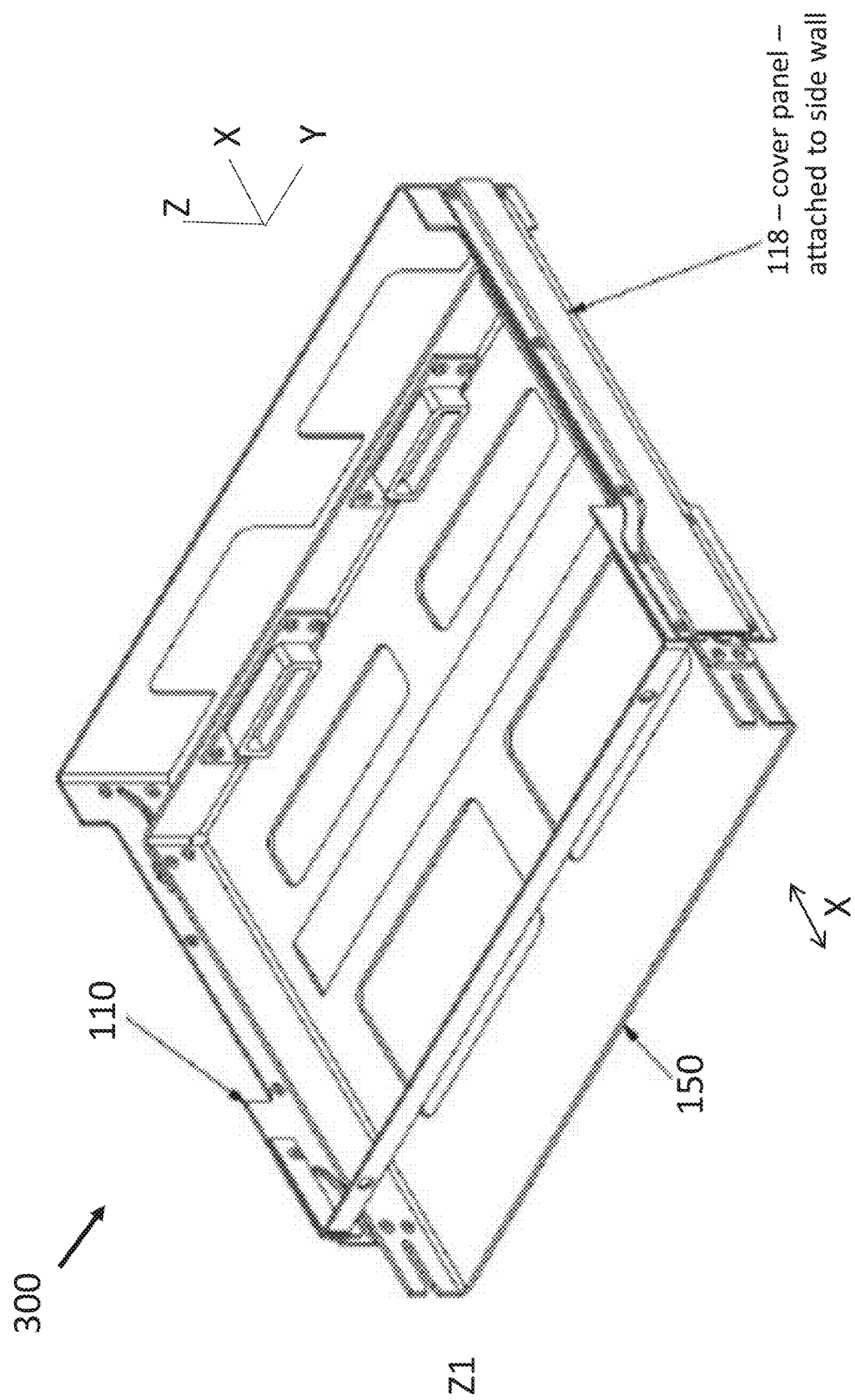
FIG. 6A shows the tray guided-pin sliding mechanism in an opened position.
Figure 6B:
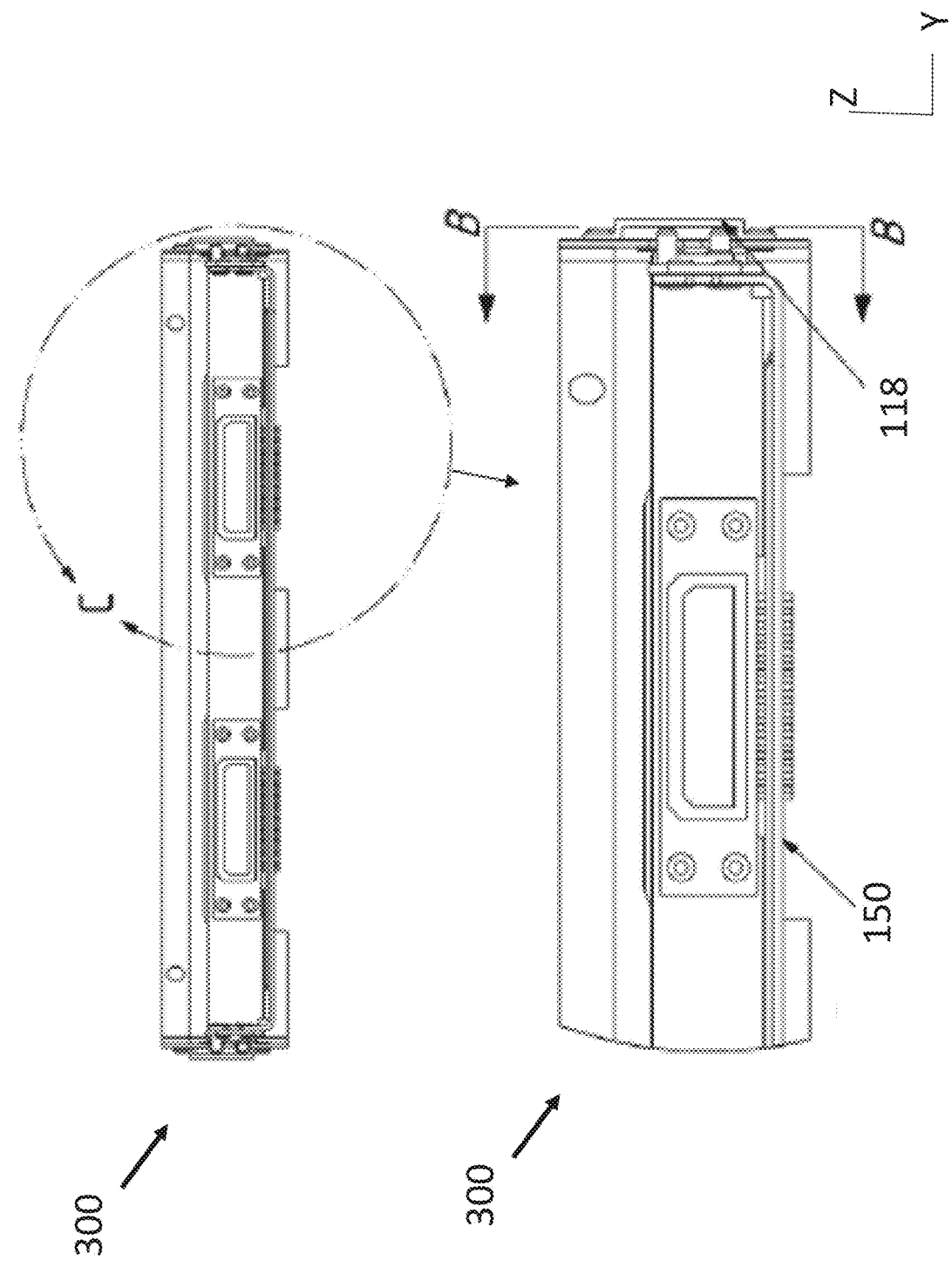
FIG. 6B depicts plan views from the rear with an enlarged view of the arrangement of the headers.
Figure 6C:
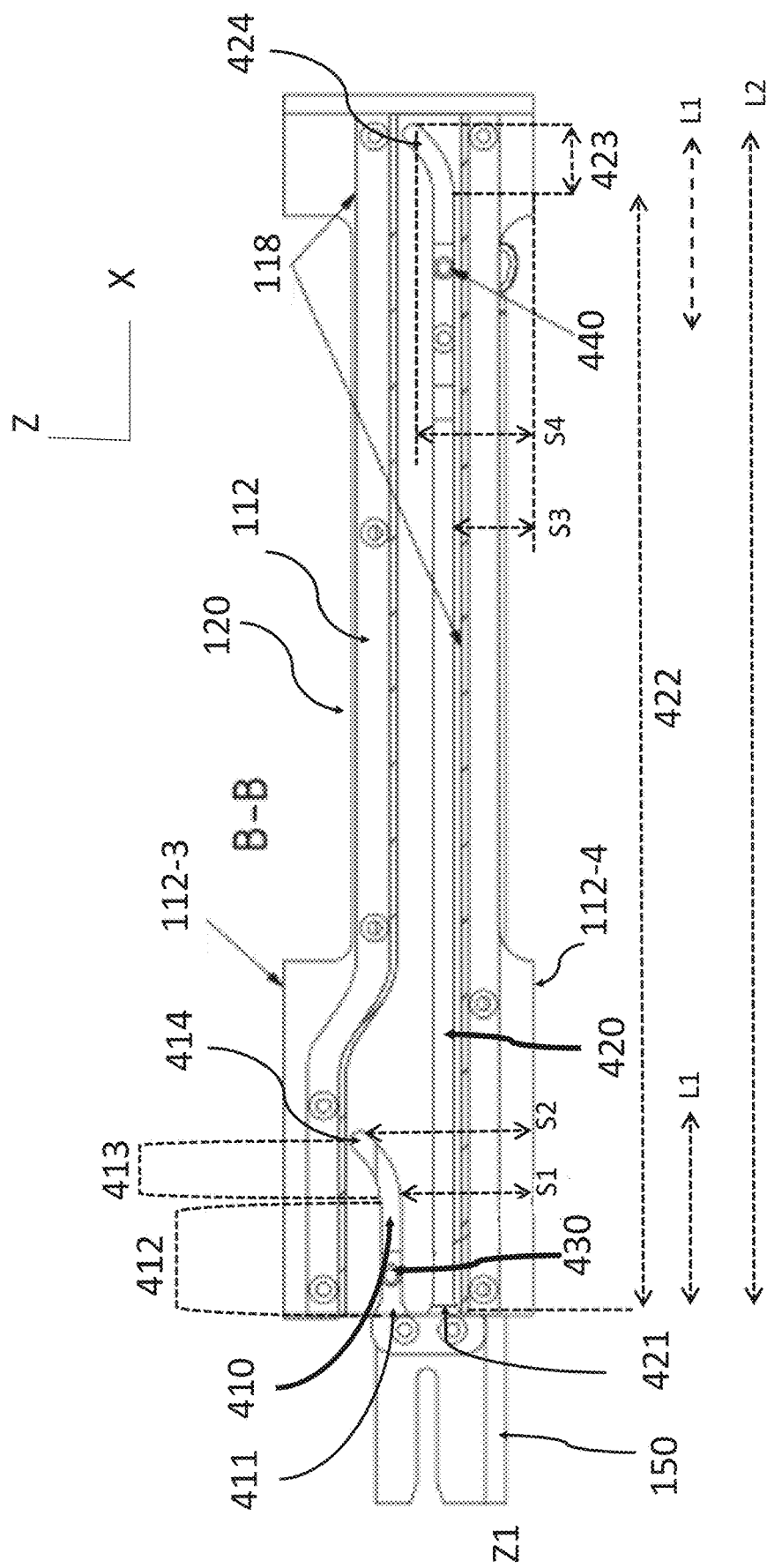
FIG. 6C depicts a partially cut-away side view of the tray guided-pin sliding mechanism in an opened position.

With reference to FIGS. 6A to 6C, the tray is shown located in the chassis and in the open position. In use the tray is moved relative to the chassis by application of a force (push or pull) in the X direction. The tray moves by translation as the guide pins 430, 440 move in the slots 410, 420. As described above the rear most end 414, 424 of each slot is raised (Z-direction) relative to the front ends 411, 421 and the linear portions 412, 422. In effect, as the tray is moved from the open position to the closed position, that movement is guided by the guide pins located in the guide slots. As the guide pins are moved along the first horizontal portions 412, 422 of the respective guide slots 410 and 420, the tray is translated at a first lower vertical position (Z1) relative to the chassis. When the tray is further inserted and moved in the direction of the closed position, the guide pins are moved along the second sloped portions 413, 423 of the guide slots, and the vertical position of the tray relative to the chassis is changed—the tray is moved to a second vertical position higher than the first. In the closed position the tray is located at the second higher vertical position (Z2). This provides for coupling of the control unit 130 located in the tray 150 with the cold plate 180 in the operating position. The range of movement of the tray in the X direction relative to the rack chassis is effectively defined by the length L1 of the first upper slot 410. The range of movement of the tray in the vertical (Z direction) relative to the chassis is defined by the difference in height of the raised end portion of the slots relative to the lower linear portion.

FIGS. 6A to 6C provide views of the rack assembly 300 when the tray 150 is located in the open position. The drawings 6A and 6B show the relative location of the tray and rack chassis when the tray is in the open position and vertically located at the first lower vertical position (Z1) relative to the chassis.

Referring to FIG. 6C the features of the slots and the interaction of the guide pins 430 and 440 with the slots 410 and 420 are shown. The upper slot 410 comprises an opening 411, horizontal portion 412, sloped portion 413 and end stop 414. The lower slot 420 comprises an opening 421, horizontal portion 422, sloped portion 423 and end stop 424. The upper slot supports the guide pin 430 at different levels relative to the lower edge surface 111-4, 112-4 of the side wall 111, 112 including the lower level s1 and uppermost level s2. The lower slot supports the guide pin 440 at different levels relative to the lower edge surface 111-4, 112-4 of the side wall 111, 112 including the lower level s3 and uppermost level s4. In FIG. 6C the guide pins 430, 440 are located to the forwardmost position of their range of movement (X-direction) in the slots and at the lower levels (Z-direction) of their range of movement—the tray is in the open position and located at the lower tray level Z1 within the rack chassis. When the tray is in the closed position the guide pins are then at the end stop positions at the rearmost portion of the range of movement in the X direction and at the uppermost levels of the range of movement in the Z-direction. The tray is then located at the upper tray level Z2 within the rack chassis.

Figure 7A:
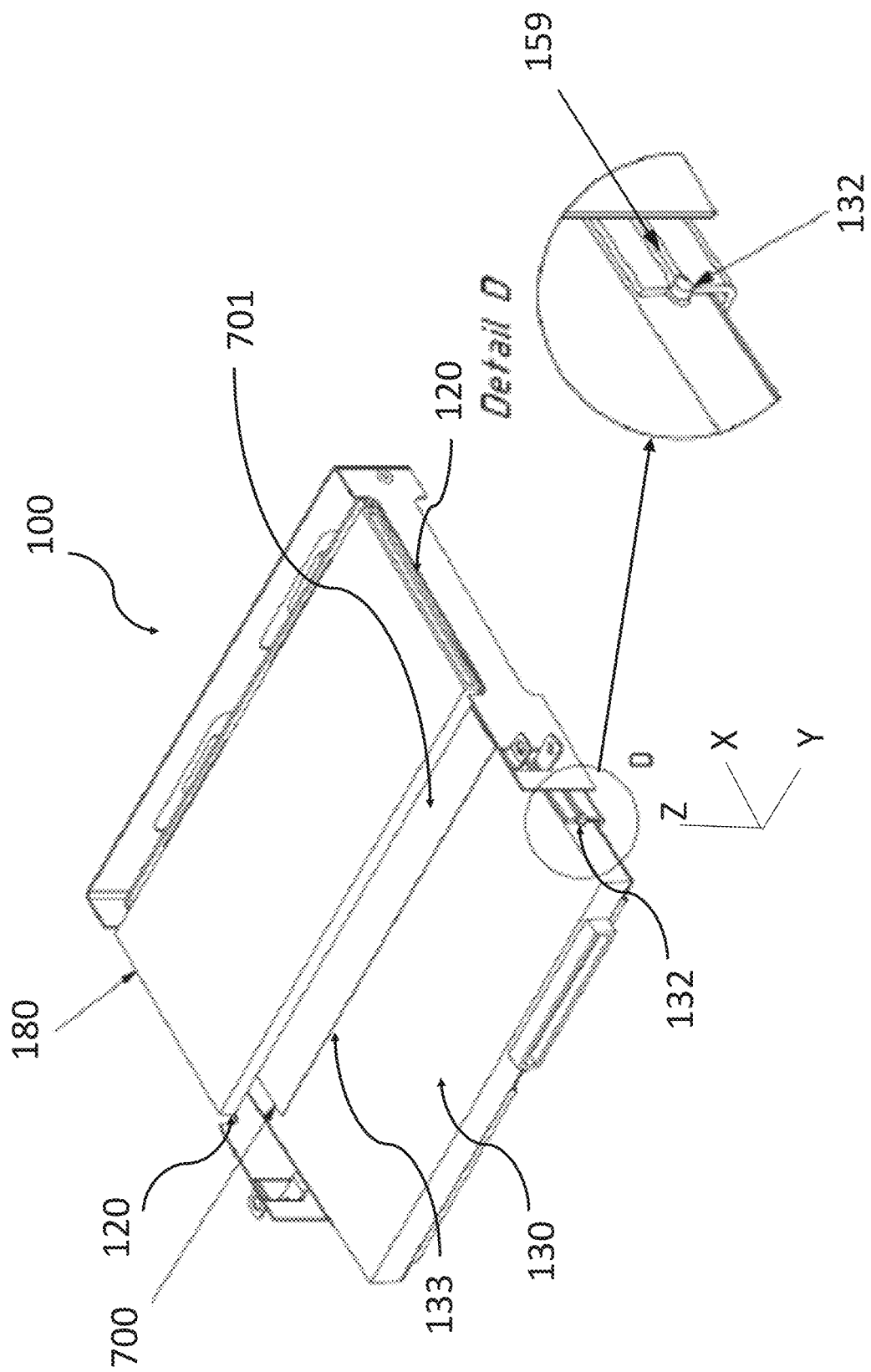
FIGS. 7A to 7C show the analogous process in FIGS. 6A to 6C for the guided-pin rack design.
Figure 7B:
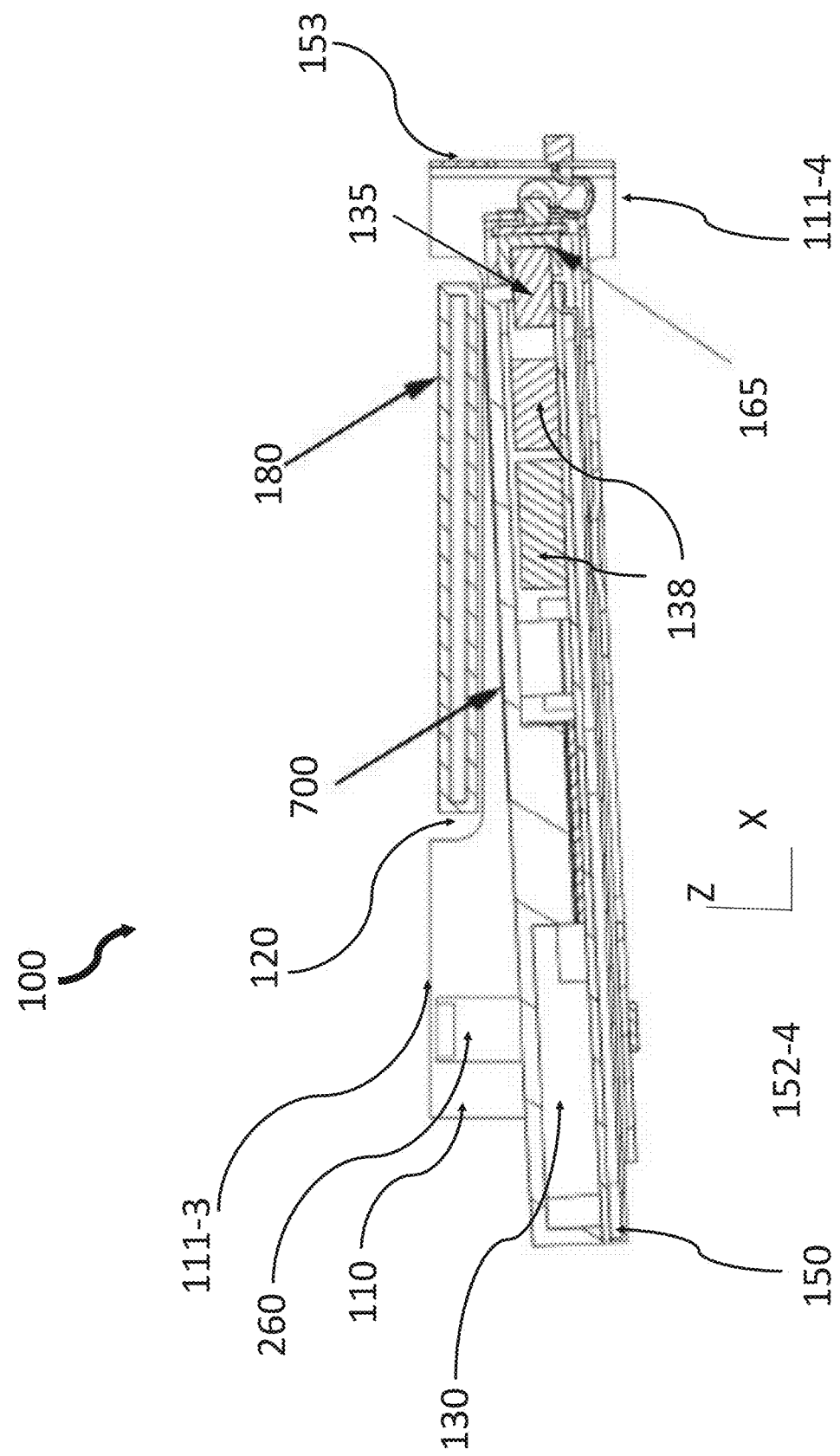
Figure 7C:
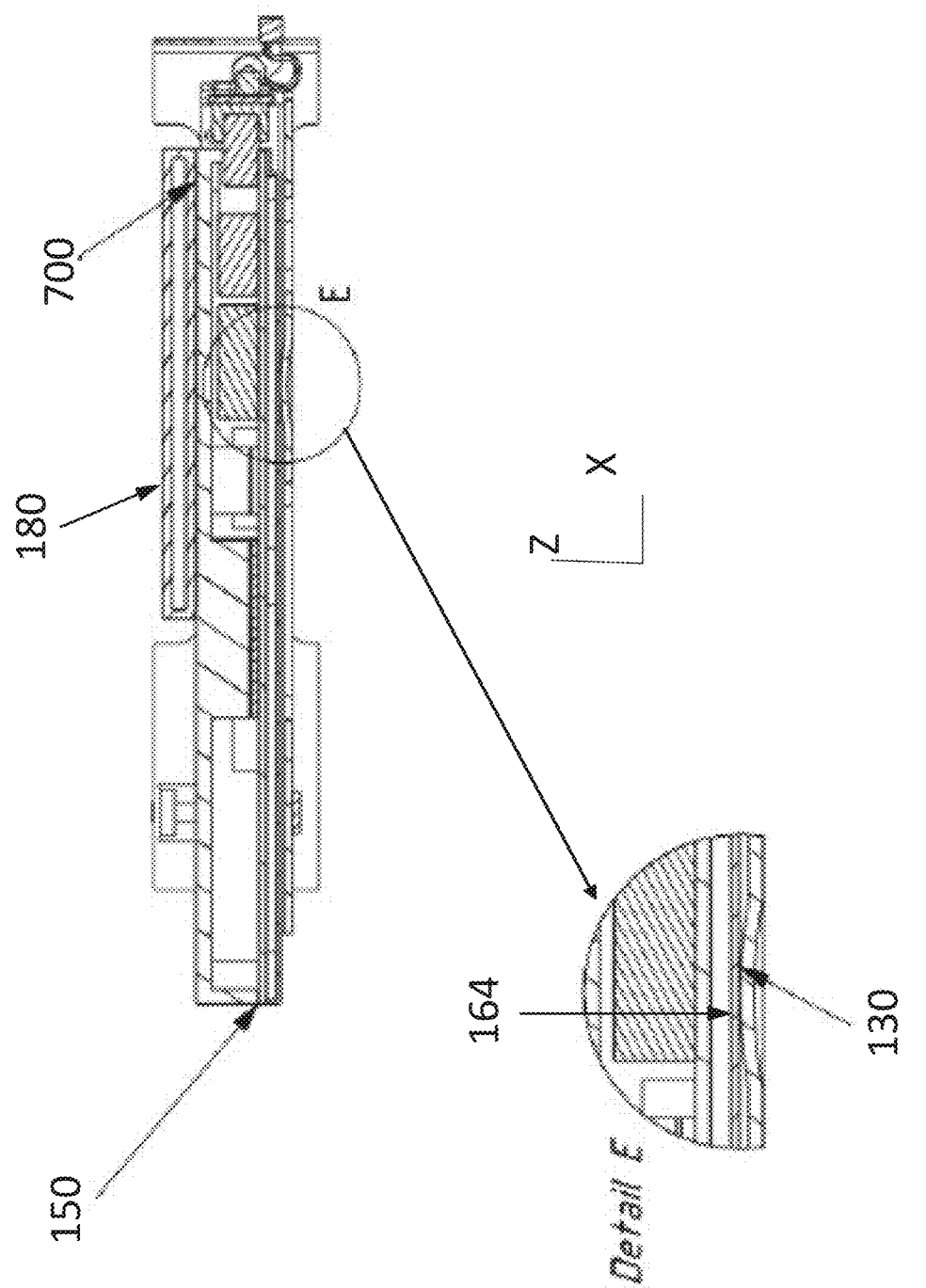

Referring to FIGS. 7A, 7B and 7C, features of the control unit 130 are described in more detail. It is appreciated that the rack assembly unit 100, 300 and control unit 130 are configured for correspondence. Further the control unit 130 is configured to be receivable in the tray 150 and for mating with the tray. As noted above the exemplary arrangements of the specification advantageously provide for coupling of the control unit as required for operation with the vehicle.

FIGS. 7A to 7C and 8A to 8D shows some further details of the coupling of the interaction of the control unit and rack assembly unit 100 (FIG. 7) and the rack assembly unit 300 (FIG. 8) respectively and the arrangement for coupling the control unit with the cold plate.

Referring to FIG. 7, the tray comprises a slot 159 for receiving a corresponding coupling pin 132 of the control unit 130. The control unit comprises a control unit housing 131. The coupling pins are located on opposite side walls of the housing. It is appreciated that various electronic components may be provided in the control unit housing. The control unit is configured such that in the operating position within the rack assembly it is located such that active cooling is provided to the components of the control unit that require cooling. The TIM 700 may be provided in a layer 701 on a TIM receiver portion 133 of the housing 131 of the control unit 130. In FIG. 7A, the tray is in the open position for example, to allow insertion of the control unit, and as can be seen the TIM 700 is located on an upper portion of the control unit. The cold plate 180 is located supported on the cold plate receivers 120 of the rack chassis. The rack assembly and control unit are arranged such that as the tray is inserted to the closed position, the TIM 700 is moved into position with and aligned as required with the cold plate 180, the interaction rack chassis, tray and control unit also provides for a thermal coupling of the control unit to the cold plate 180 at the TIM layer 701.

FIG. 7B shows a rack assembly 100 with the tray 150 in the open position, tilted relative to the rack chassis 110 and with the control unit 130 located in the tray. In the open position, the control unit 130 and the TIM 700 are located below the cold plate 180 and at an angle to the cold plate. Some clearance space may be provided between the cold plate and the control unit such that there is no physical contact between the control unit and the TIM layer and the cold plate in the open position. The connector 135 of the control unit is connected to header 165 of the tray and to FFC connector 166 at the rear of the rack assembly unit.

FIG. 7C shows the rack assembly 100 after it has been moved from the open position to the closed position. The control unit 130 is by virtue of the combination of features of the rack assembly and the control unit located in the operating position, for use within the vehicle. The control unit 130 is coupled via the TIM 700 to the cold plate 180 for heat transfer. The connectors 135 of the control unit 130 are coupled via the headers 165 of the tray and connectors 166 for connection to the backplane of the vehicle system. The detail of FIG. 7C shows the interaction of the bead 164 located on the base 150 of the tray with the control unit 130.

Referring to FIG. 8A the tray is located in the open position of the rack assembly unit 300 comprising the guide slot coupling mechanism 400. A guide pin 132 of the control unit is located in the slot 159 of the tray. A fixing arrangement of the rack assembly 300 is also shown. The rack chassis comprises a controller fixing bracket 117 having first and second apertures 119. As shown a second fixing bracket 137 is provided coupled to the control unit and to the tray.

Figure 8B:
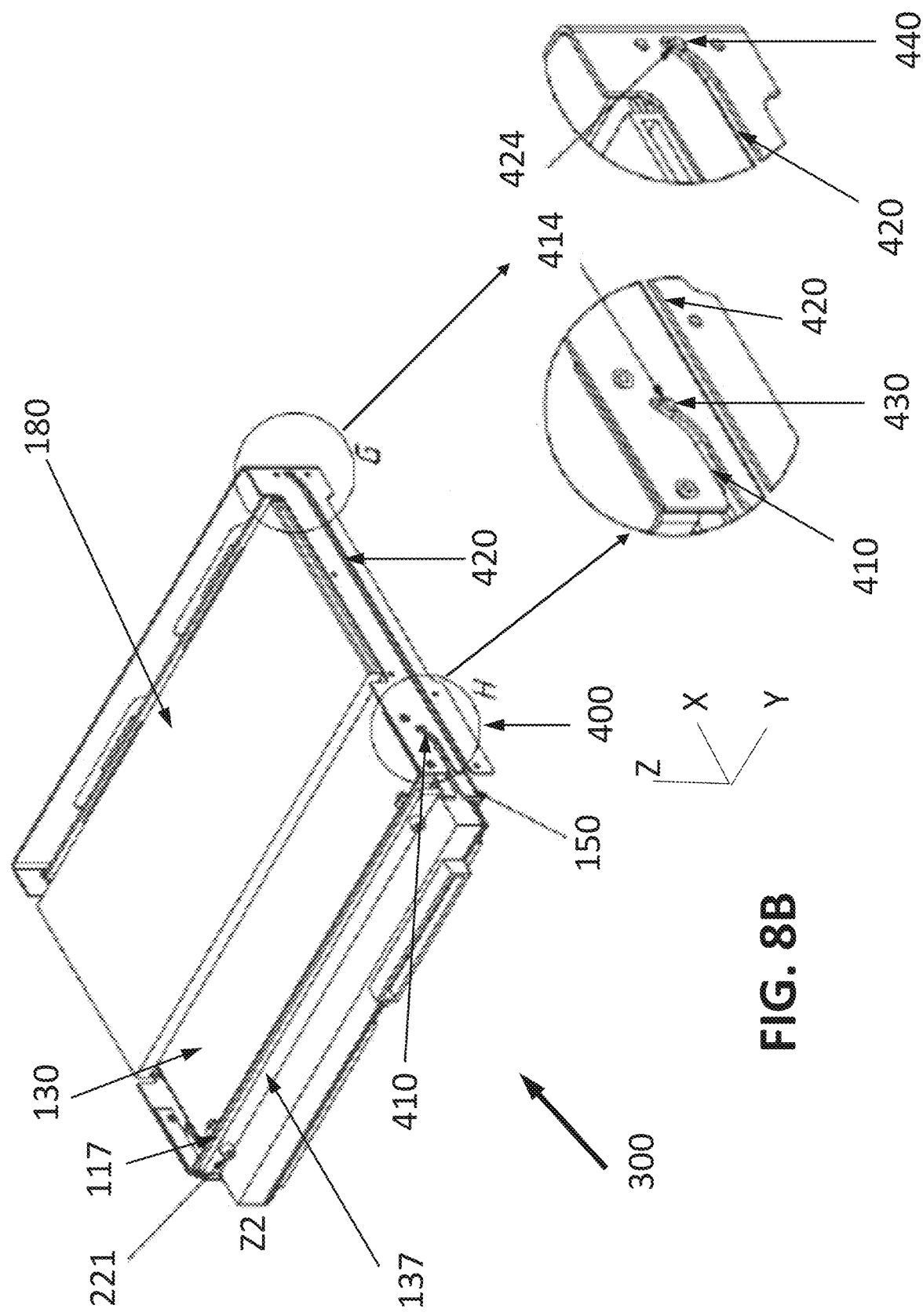

The control unit 130 comprises a TIM 700 provided in a TIM layer 701 in a receiver 133 of the housing thereof. As shown in FIGS. 8B and 8C when the tray 150 of the rack assembly 300 is moved to the closed position—it is translated in the direction of the rear of the rack chassis, and also to the second upper vertical level within the chassis. As described above, each guide rail slot 410, 420 comprises two levels (Z-direction). The control unit in the tray is accordingly moved upwardly within the rack chassis and coupled to the cold plate via the TIM 700 in the closed position of the tray.

When the tray is moved to the closed position, as shown in FIG. 8B, the fixing brackets 137 and 117 are brought into contact, they are engaged together at the fixing apertures 119, 139 using fixing screws 221 to fix the rack assembly unit 300 in the closed position. This fixing is also shown in cross-section in FIG. 8D.

Figure 9A:
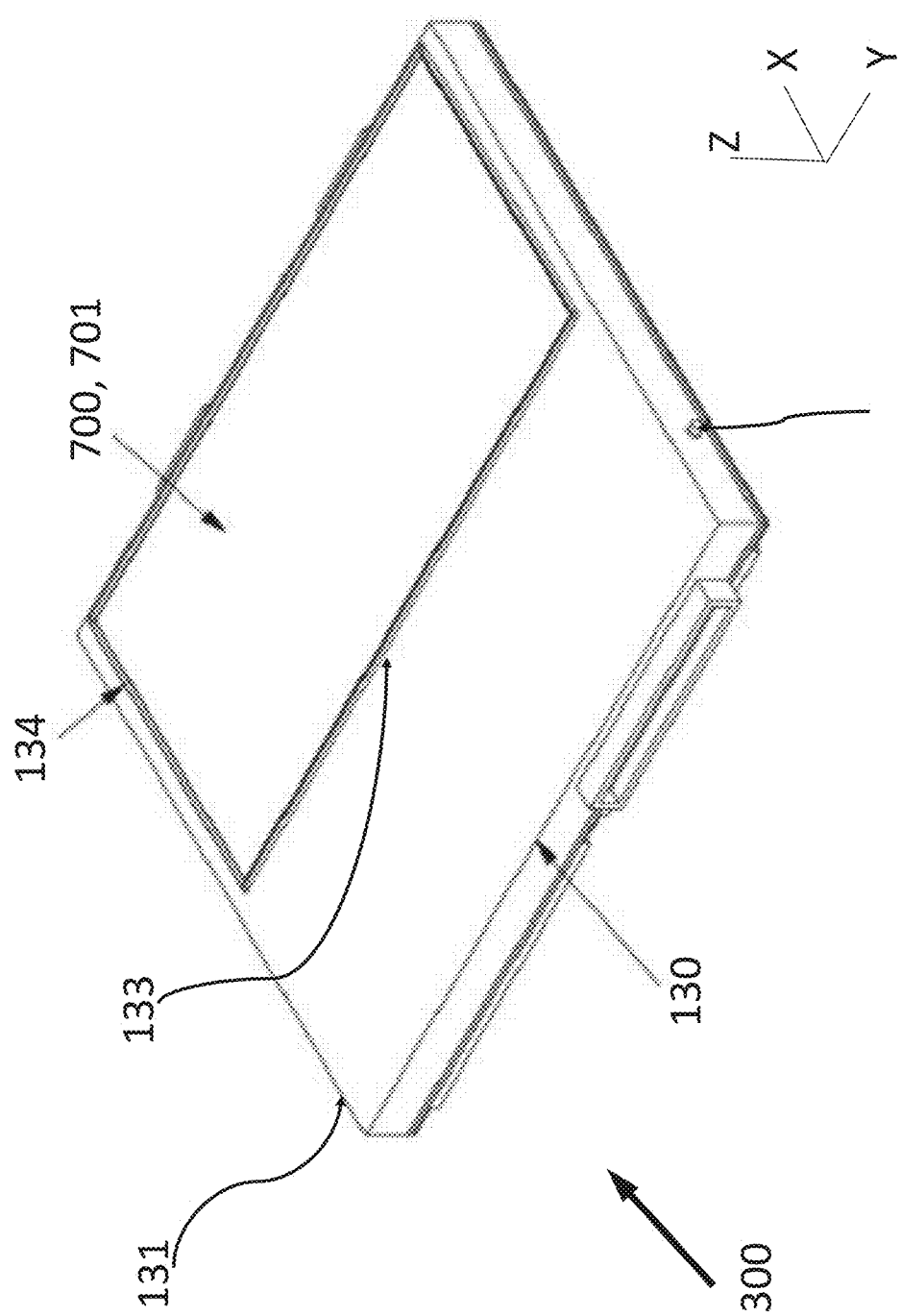
FIG. 9A shows a perspective view of a control unit according to the specification having a TIM layer 701 located on the housing thereof.

Referring to FIGS. 9A to 9C, an exemplary arrangement of a control unit 130 comprising the TIM 700 in a layer 701 is described. The control unit in the exemplary drawings is located in rack assembly 300. The control unit 130 comprises a TIM receiver 133 located on an upper external surface of the housing 131 thereof. A groove 134 is formed in the upper surface, in the exemplary arrangement the groove defines a rectangular shaped TIM receiver. The groove 134 defines the perimeter of the receiver 133. As shown in FIG. 9C, the groove is recessed relative to the surface and a seal 710 for example an O-ring is located in groove 134. The TIM 700 is provided in a layer 701 on the housing in the receiver defined by the groove. In the closed position of the tray and the operating position of the control unit, as shown in FIGS. 9B and 9C, the control unit is coupled to the lower surface of the cold plate 180 via the TIM 700. The seal 710 is engaged with respective heat transfer surface of both the control unit housing and the cold plate.

Referring to FIGS. 9B and C in conjunction with FIG. 1A, the heat transfer that is provided is described in more detail. FIG. 1A illustrates an automotive rack server 500 equipped with cold plate 180 and electronic control units 130, a thermal interface 750 where a heat transfer surface of each of the cold plate and the control unit are thermally coupled and heat flow path 760 indicated schematically by arrows. In order to allow heat flow from the electric/electronic components 138 inside the control unit 130 to the cold plate 180, an efficient heat flow path 760 is established. In the arrangement of the drawings a heat flow path 760 is based on use of the thermal interface material, TIM, 700 arranged between the cold plate and the control unit. The TIM 700 material is used to reduce the so-called thermal contact resistance between the mating heat transfer surfaces, and hence allows improved heat flow across the thermal interface, TI, 750. TIM 700 may be provided in the form of a gel, grease, soft compliant pad, or phase change material. Other TIM types are also possible. To allow efficient heat transfer through the layer 701 of TIM, it is arranged such that it is located between the heat source e.g., the control unit housing and the cold plate, while both components are firmly pressed against each other. Contact pressure plays a major role in improving the thermal joint heat conducting efficiency, as it reduces interface thickness and allows to fill micro-scale cavities by TIM. Both effects improve thermal conductance of the thermal interface 750.

Figure 1B:
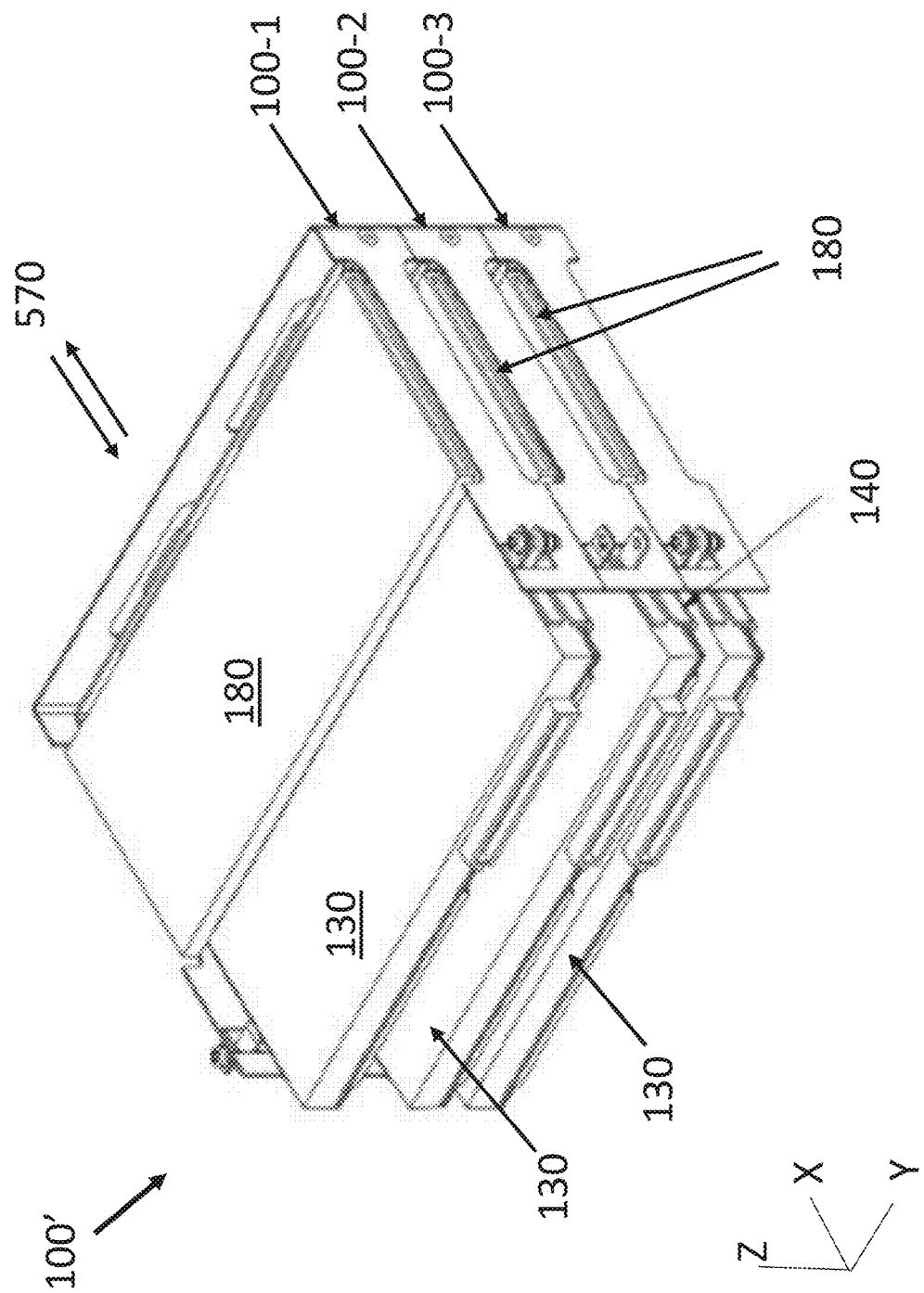
FIG. 1B shows a perspective view of a rack of rack assembly units according to an arrangement of the specification.

Referring to FIGS. 10A, 10B and 10C, alternative view of the stack 100' of FIG. 1B are shown. With reference to the Figures the features and control of the relative positions of the control unit 130, TIM 700 and cold plate 180 located in a tiling tray a rack assembly 100, are described. As shown in FIG. 1B and FIGS. 10A, 10B and 10c, the tray in the middle is in the open position, the tray is tiled relative to the rack chassis. The control unit comprises a TIM 700 arranged on an upper surface thereof as described with reference to FIG. 9 in a TIM receiver 133 surrounded by a groove 134. A sealing member for example an O-ring 710 is located in groove 134. In the open position, the control unit and TIM are not in contact with the control located in proximity to the cold plate and at an angle relative to lower surface thereof and aligned for coupling to the cold plate as the tray is moved to the closed position. Referring to FIG. 10B, the control units 130 located in the upper and lower trays in the closed position are shown coupled to the cold plate 180 via the TIM 700. Also shown is the coupling of the connector 135 of the control unit to the header 165 of the tray.

Further, the exemplary rack assembly arrangements 100 and 300 are configured to create a leakproof enclosure for a phase change thermal interface material, TIM, 700 located between the control unit housing 131 of the control unit 130 and cold plate 180. The rack assembly 100, 300 is further configured to provide for generation of a contact force at the thermal interface, TI, 750 between the control unit and the cold plate 180.

An advantage of the exemplary rack assembly arrangements of the specification and an objective problem solved by the example rack and track assembly is to protect the TIM 700, which is a layer 701 on a housing 131 of a control unit 130, to protect against damage from replacing the control unit following a replacement process. In addition, the example rack and track assembly is configured to overcome a problem of generating a necessary contact pressure at the TIM, between the control unit and the cold plate(s) 180, which are fixed to the rack chassis 110.

For example, some automotive electronic control units, ECU, are being replaced by more complex domain control units, DCU, or, increasingly frequently, multi-domain control units, MDC. Both type of control units (or simply controllers) are devices designed to support and control various functional domains of a vehicle, like advanced driver assistance systems, ADAS or infotainment systems. The DCUs are typically less complex devices, developed to operate in a single domain, while MDCs control functionalities from more than one domain.

In case of the high-performance control units 130, e.g., dedicated to ADAS functionality, for which power dissipation reaches 150 W and beyond, utilization of forced liquid cooling is typically the only possibility to keep the temperature of the fragile electronics within the safety and lifetime limits. This is due to a high maximum ambient temperature typically seen in automotive applications when driving the vehicle under operating conditions (50° C. and more) and limited thermal robustness of logical components, like system-on-a-chip or memory modules. A liquid cooling system 181 circulates liquid coolant inside a cold plate 180, which is a device used to dissipate thermal energy from the hot areas. Such a cold plate 180 can be integrated within the vehicle rack server 500, not being replaceable with a control unit 130. FIG. 1A illustrates a schematic representation of the automotive rack server 500 equipped with a cold plate 180 and electronic control units 130. In the schematic representation, heat flow path 760 between these components is marked by arrows.

In order to allow heat flow from the electric/electronic components inside the control unit 130 to the cold plate 180, an efficient heat flow path is to be established between these components. One possible method of realization of such a heat flow path is to use thermal interface material, TIM, 700. TIM material 700 is used to reduce the so-called thermal contact resistance between the mating surfaces, hence allows improved heat flow across the interface. To allow efficient heat transfer through a layer 701 of TIM, it is applied between the heat source (e.g., the control unit housing 131) and the cold plate 180, while both components are firmly pressed against each other. Contact pressure plays a major role in improving the thermal joint heat conducting efficiency, as it reduces interface thickness and allows to fill micro-scale cavities by TIM 700. Both effects improve thermal conductance of the interface.

In case of the vehicle rack server and control unit rack assembly 100, 300 in a car, a number of technical issues may arise examples of which are noted below:

1. creating thermally efficient heat flow path between the control unit housing 130 and a cold plate 180, for electronics cooling purposes,
2. method for assembling a control unit housing 130, 131 and a layer 701 of TIM into the rack 100, 300, while protecting the layer of TIM from damage during plugging-in of the control unit,
3. applying suitable contact pressure to the thermal interface filled with a layer 701 of TIM, without damaging fragile electronics or mechanical components (connectors),
4. in the case of utilization of a phase change thermal interface material 700, development of a leak-proof TIM application region 133, 134, 710, which would prevent leaking away/dripping off of the TIM in its liquid state,
5. exerting suitable contact force on a thin layer 701 of TIM 700, under the rack's geometric tolerances resulting from manufacturing process,
6. providing a universal, cost-efficient, and compact rack 100, 300, suitable for all vehicle classes, from economic to luxury vehicles,
7. providing a modular rack 100, 300, which could be easily scaled up and down, depending on the required number of plug-in slots,
8. providing a rack, that allows for fast and easy replacement of control units, with only a limited access to these devices (resulting from rack's placement in a car), particularly from the front side (opposite side to the backplane board in FIG. 1A), A first problem addressed by the exemplary arrangements of this specification and an advantage of the arrangements of the claims is associated with 'creating thermally efficient heat flow path 760 between control unit housing 131 and a cold plate 180, for electronics cooling purposes', is addressed by the example designs which use a layer 701 of thermal interface material 700 in between control unit housing 131 and a cold plate 180. In order to maintain the required cleanliness of the device, it is assumed that the solid-state TIM 700 is used between the control unit housing 131 and the cold plate 180, which can be easier for replacement, less 'messy' and more stable, compared with thermal greases or gels. However, it is appreciated that alternatives are possible, which is suitable for application of phase change material.

A second problem addressed by the exemplary arrangements of the specification and an advantage of the arrangements of the claims is associated with assembling a control unit (e.g., a control unit) housing and a layer of TIM into a rack, while protecting the TIM from damage during plugging-in of the control unit is addressed by the example designs by applying the TIM 700 to the housing 131 of the control unit 130 before its insertion to the tray 150. Subsequently, the control unit is inserted to the opened tray. In the next step, the tray is closed by rotating it around the rotation axis 201 (hinge mechanism 200) or by pushing it through the guiding cut-outs 410, 420 (second guide-pin fixing mechanism 400 alternative). In the last step, the control unit's position is fixed, and the necessary contact force is applied to the thermal interface 750, by the fixing screws 220, available at the front of the rack 100. In this procedure, TIM is engaged in contact with the cold plate 180 already when it reaches its final location in the assembly, therefore it is protected from any physical interaction with the rack components during the assembly process. Hence, the risk of a potential damage to the TIM layer is limited.

Another problem addressed by the exemplary arrangements of the specification and an advantage of the arrangements of the claims is associated with 'applying suitable contact pressure to the thermal interface filled with a layer of TIM, without damaging fragile electronics or mechanical components (connectors)', is addressed by the example arrangements by elimination of any fragile components from the load transfer path. In both example arrangements, the contact force is transferred between the fixing screws 220, control unit housing 130, tray 150, and rack mechanical components: hinges 205, 255 or guiding cut-outs 410, 420, 430, 440. The backplane board connectors 575 are isolated from the loading path by using a flat flexible cable 166 (FFC), which connects backplane board 570 with the connector 165 fixed to the tray. Therefore, any force resulting from pushing the tray against the cold plate during the assembly process is compensated by the deflection of an FFC tape. Hence, no damaging force is exerted on the connectors. Another possible realization of electrical connection between the control unit 130 and the backplane board 570 is to use the so-called floating board-to-board connectors instead of FFC tapes and connectors 166 These electrical connectors are capable of compensating translational and angular misalignment, hence do not generate unwanted force on the PCBs, to which they are attached. Another advantage of using floating connectors is higher signal integrity, due to lower electrical noise injected to the system when FFC tapes are eliminated and the number of physical interconnections are minimized.

A further problem addressed by the exemplary arrangements of the specification and an advantage of the arrangements of the claims is 'utilization of a phase change thermal interface material, development of a leak-proof TIM application region, which would prevent leaking away/dripping off of the TIM in its liquid state', is addressed by the example designs by preparation of a sealed area 133 of application for the phase change thermal interface material 700, which is located on the top of the control unit 130. This area is surrounded by a groove 134 with an O-ring 710 placed inside. In the assembly process, when control unit's housing is pushed against the cold plate, the O-ring 710 is pressed to the cold plate surface as well and seals the region it bounds. In this region, a phase change TIM 700 can be applied.

A further problem addressed by the exemplary arrangements of the specification and an advantage of the arrangements of the claims is directed to 'exerting suitable contact force on a thin layer of TIM, under the rack's geometric tolerances resulting from manufacturing process', is addressed by introduction of fixing screws 220 allowing to adjust and simultaneously limit the contact force and the position of the tray 150 (loaded with the control unit 130) in the rack 170. Additionally, a specially designed bead 164 in the bottom surface 155 of the tray 150 improves the distribution of the contact force on the control unit housing 131.

Another problem addressed by the exemplary arrangements of the specification and an advantage of the arrangements of the claims is connected with 'a universal, cost-efficient, and compact rack, suitable for all vehicle classes, from economic to luxury vehicles', is addressed by using a simple sheet metal structure for the rack including the rack chassis and the tray components, which can be screwed, riveted, or welded into a final product. Sheet metal components of the example rack are cut out or stamped from metal sheets, and bended into the required shape, allowing for cost-efficient design suitable for all classes of vehicles. Additionally, the example design is based on simple geometrical features (hinges or guiding cut-outs) which allow replacement and fixing the position of the control unit 130, without the need for sophisticated or complex mechanisms.

An additional problem addressed by the exemplary arrangements of the specification and an advantage of the arrangements of the claims is connected with 'elaborating a modular rack design, which could be easily scaled up and down, depending on the required number of plug-in slots', is addressed by designing a segment or rack assembly unit 100, 300, which can be replicated in the final rack structure comprising a number of stacked rack assembly units as many times as needed, for accommodating the required number of control units 130 for example, DCUs/MDCs.

Another problem, addressed by the exemplary arrangements of the specification and an advantage of the arrangements of the claims, is connected with 'elaborating a design of the rack, that would allow for fast and easy replacement of control unit units 130, with only a limited access to these devices (resulting from rack's placement in a car), particularly from the front side (opposite side to the backplane board in FIG. 2)', is addressed by designing the rack-tray mechanism 100, 300 in such a way, that it requires to be accessed only from the front, in order to insert, extract and fix the position of the control unit 130 in a rack. Additionally, if a cold plate 180 needs to be cleaned from the unwanted remaining of TIM, this can be done after removal of the control unit 130 from the tray 150.

The exemplary rack assembly 100, 300 according to the specification may for example be built from components made from metal sheets assembled together. This can be done by means of riveting (example shown in the pictures below) or other suitable method, like welding, screwing or other. Advantage of this approach is the low cost in mass production. The parts are first cut out of large metal sheets (aluminum alloys or steel, possibly other material like magnesium alloy), bended into the required shape, assembled and fixed into the final shape of the rack. Other advantages of such assembly are the low weight and compactness, due to low wall thickness of the components, in an exemplary arrangement, of the order of 1 mm. Additionally, both the rack assembly alternatives based on tray-tilting 200 and tray guiding 400 mechanisms, can be built by using relatively simple, inexpensive components, like hinges and guiding pins.

FIGS. 2A to 2D, 3A to 3D, and 4A to 4D show a general view of a rack assembly unit or segment 100, equipped with the hinge mechanism and guided-pin mechanism (FIGS. 5A to 5E, 6A to 6C).

The role of the components enlisted in the figures include as follows:

Rack chassis 110—serves as a support to all other components and allows mounting the complete assembly in a car, Tray 150—serves as a support for the control unit housing 130. Additionally, transmits the thermal interface force between the rack chassis 110 and the cold plate 180, allowing to limit the unwanted mechanical load on the fragile components, like PCB, connectors, etc. The complete force transmitting components' chain is the following: cold plate 180→thermal interface material 700→control unit housing 131→tray 150→hinges/guiding pins 200, 400 and fixing screws 220, 221→rack chassis 110, Fixing screws 220, 221—used to fix the position of the tray in the rack chassis. Screws also generate and limit the fixing force in the mechanism (in both, tray-tilting 200, and guided-pin 400 arrangements), allowing for the required contact pressure in the thermal interface material 700, between the control unit's housing 131 and the cold plate 180, Flat flexible cable (FFC) with the connector 166—compensates the angular and linear displacements of the tray, resulting from opening and adjusting tray's position by the fixing screws. The FFC connects header 165 fixed to the tray, with the connector plugged-in to the backplane board 570, Headers 165 in the tray—used to connect rear connectors 135 of a control unit 130 with the backplane board 570 (via the FFC tapes and connectors 166), Fixing brackets 220, 265 and 117, 137—in both alternative arrangements, the fixing brackets 265 or in the alternative arrangement fixing brackets 117 are available on the rack chassis 110 and corresponding fixing brackets 210 are located on the tray 150 or provided as a fixing bracket 137 coupled to the control unit 130 and to the tray 150. In either case, they allow to use fixing screws 220, 221 to fix the position of the tray in the rack, control unit housing contact bead 164—a bead 164 stamped in the tray's bottom wall 155, to compensate geometry inaccuracies resulting from manufacturing and assembly processes. When formed on the tray's bottom, bead 164 creates a line contact between the control unit housing 131 and the tray 150. Because it is separated (lifted above) from the remaining part of the tray's bottom wall 155, the bead 164 assures the presence of the contact, indifferently from the tray tolerances. Additionally, the two fixing screws 220 generate force, which pushes the tray 150 against the control unit's housing 131. This force can deflect tray's thin-walled structure, improving the contact between the bead 164 and control unit housing 131, Hinges 205 (tray tilting mechanism 200)—connect the tray with the rack chassis at a hinge 205 and hinge receiver 255, allowing rotational movement (tilting) the tray 150, Pin guiding cut-outs (guided-pin mechanism 400)—cut-outs or slots 410, 420 provided in the side walls 111, 112 of the rack chassis 110, which guide the pins 430, 440 located on the sides 151, 52 of the tray 150. The shape of the guiding cut-outs 410, 420 provides two-types of movement in the tray relative to the chassis:

firstly, linear tray movement is generated by the horizontal portions 412, 422 of the cut-outs/slots 410, 420, allowing sliding of the tray parallel to the cold plate 180 bottom surface, secondly, non-linear trajectory movement is generated by the sloped portions 413, 423 of the cut-outs/or slots 410, 420, forcing the tray 150 (loaded with the control unit 130) to be pushed against the cold plate 180, therefore assuring thermal interface 750 between control unit 130 and the cold plate 180.

Guiding cut-outs cover 118 (guided-pin mechanism 400)—a plate 118 covering the cut-outs 410, 420 in the rack side walls 111, 112, protecting the mechanism and adding stiffness to the structure, Front and rear guiding pins 430, 440—cylindrical pins attached to the tray 150, arrangement for sliding through the cut-outs 410, 420 in the rack chassis 100.

FIGS. 4A to 4D show the design details of the tray tilting mechanism, with the tray opened, ready for insertion of the control unit housing. The tilting angle is limited in the example solution by two design features: cut-out 260 in the rack side wall, stopping the fixing bracket 210 attached to the tray (FIGS. 4C and 4D) and cut-out 270 in the rack rear wall 153 (backplane board side) stopping the hinge rotation stopper 244 (FIG. 4D).

Another possible realization of the rack equipped with tray-tilting mechanism described in this document is based on the utilization of floating connectors, to connect a control unit mounted in the tray, with the backplane board. Floating connectors can replace the FFC tape, allowing for small-scale compensation of angular and planar misalignments. Typical misalignment which can be compensated by floating connectors reaches less than 1 mm of translational positioning inaccuracy in planar X and Y directions, and less than 3 degree of angular misalignment. Hence, utilization of this type of devices requires higher rack manufacturing and assembly accuracy compared with the solution based on the FFC tape. The advantage is in the reduction of electrical noise generated in the connection, which is highly desired from the signal integrity point of view.

FIGS. 7A to 7C shows the consecutive steps of insertion of a control unit into the rack equipped with the tray-tilting mechanism. In order to do so, the following steps are carried out: Insertion of the guiding pins 132 on the control unit's housing 131 into the cut-outs 159 in the tray side walls 151, 152, while tray tilted at an angle relative to the chassis into the opened position, Pushing the control unit 130 into the opened tray 150, until it reaches its final mounting position, in which the control unit's rear connectors 135 are fully inserted into the tray's headers 165, Rotating the tray loaded with a control unit 130 into its final position, until the TIM 700 on the top of the control unit's housing 131 is in contact with the cold plate 180, and Fixing the tray's final position and generation of the force in the thermal interface between the control unit and the cold plate, by tightening the fixing screws 220 in the fixing brackets 265 and 210—contact bead 164 in the bottom 155 of the tray pushes against the a control unit housing 131. FIG. 7C illustrates the tray loaded with a control unit fixed in its final position—thermal interface 750 is established between the control unit 130 and cold plate 180, with an enlarged view detailing the contact bead 164 in the bottom wall of the tray pushing against the DCU/MDC housing/control unit housing 131.

FIGS. 8A to 8D show the consecutive steps of insertion of a control unit into the rack equipped with the guided-pin mechanism by performing the following. Insertion of the guiding pins 132 of the control unit 130 into the cut-outs 159 in the tray side walls 151, 152, while tray in the opened position. Pushing the control unit into the opened tray, until it reaches its final mounting position, in which the control unit's rear connectors 135 are fully inserted into the tray's headers 165. Pushing the tray loaded with a control unit into its final position, until the TIM 700 on the top of the control unit's housing 131 is in contact with the cold plate 180 (tray slides through a non-linear part of the guiding cut-outs, which results in a simultaneous movement towards the backplane board and the cold plate). Fixing the tray's final position and generation of the force in the thermal interface between the control unit and the cold plate, by tighten the fixing screws 221 at fixing brackets 117 and 137—contact bead 164 in the bottom of the tray pushes against a control unit housing.

The presented automotive server-like rack assembly arrangements 500 allow for utilization of enhanced thermal interface 750 between the DCUs/MDCs 130 and the cold plate 180s, which can be obtained by means of using phase changing thermal interface material 700. Typically, phase change TIMs used in the cooling systems of electronics, are solid materials in room/ambient temperatures, which change into liquid when system's temperature rises. In liquid state, phase change material, PCM, 703 flows into surface irregularities, filling the air gaps in the thermal interface, increasing its heat conducting efficiency. Typical phase change temperature of PCMs used in electronic cooling application reaches 50° C.-70° C. Above this temperature, solid PCM changes into liquid until the temperature drops again, below the same or similar value.

A problem connected with using PCMs in the automotive applications is the need of assuring leakproof of the PCM application region, which would prevent leaking away/dripping off the melted material, in the vehicle normal operating conditions (vibration, impact, etc.). The two design alternatives presented in this document, can be modified, in order to fulfil this requirement. The modification is applied to a control unit housing, by creating a groove on the surface of the control unit's housing, surrounding the TIM material 700 allowing for a control unit to cold plate interface.

As shown in FIG. 9, the groove is filled with an O-ring, which pressed against the cold plate, seals the application region of the PCM. FIG. 9 shows the groove and O-ring used in the tray-tilting rack design; however, the same modification can be applied to the rack equipped with the guided-pin mechanism. FIG. 9A shows a general view on the control unit housing 131 with a groove 134, O-ring 710 and a layer 701 of phase change TIM. FIG. 9B depicts a front view of the rack assembly unit with D-D illustrating the cross-section line through the rack assembly and the cross-section through the rack assembly, and a FIG. 9D shows an enlarged. detailed view of the O-ring pressed against the cold plate, sealing the PCM application region 133.

FIG. 10 shows a stack of three segments or three rack assembly units 100 of the tray-tilting rack type, with the middle tray in an opened position. As can be seen, the segments can be replicated and stacked one upon another, to form more capacity of the rack, hence operate with larger number of control units. Due to this feature, the example rack design is a scalable solution. FIG. 10C shows an enlarged, detailed view of a gap between the O-ring and the cold plate when a tray is in opened position. This gap allows easy blade replacement, without the risk of damaging the layer of TIM on the control unit's top surface. The gap between TIM, O-ring, and the cold plate, visible for the opened tray, allowing safe insertion/removal of the control unit modules 130, covered by a layer 701 of TIM 700.

What is claimed is:

1. A rack assembly unit for mounting a control unit to a vehicle rack system, the rack assembly unit comprising:
   a rack chassis; and
   a tray for receiving the control unit,
   wherein the tray is movably coupled to the rack chassis at a coupling mechanism, the coupling mechanism configured to provide for movement of the tray relative to the rack chassis between a first open position and a second closed position,
   wherein at the first open position, the tray is spaced apart from rack chassis to facilitate user access to the tray and to the control unit receivable therein, and at the second closed position, the tray is located fully inserted relative to the rack chassis and such that the control unit located in the tray is provided at a control unit operating position thermally coupled to a cold plate of a cooling system to provide for cooling of components of the control unit;
   wherein the control unit comprises a housing that comprises a thermal interface receiver (TIM) receiver portion for receiving a TIM layer that, in the control unit operating position, is located between the control unit and the cold plate such that a heat transfer surface of the control unit and a heat transfer surface of the cold plate are thermally coupled via the TIM layer;
   wherein the TIM receiver portion is defined by a recessed groove formed in an upper surface of the control unit, the recessed groove defining a periphery of the TIM receiver portion and having a shape corresponding to that of the cold plate; and
   wherein a seal is located in the recessed groove surrounding the TIM receiver portion.

2. The rack assembly unit as claimed in claim 1, further comprising:
   a fixing mechanism for fixing the tray in the second closed position, wherein:
   the fixing mechanism and the rack assembly unit are configured such that when the tray is fixed in the second closed position at the fixing mechanism,
   the control unit is located in contact with the cold plate to define a thermal interface therebetween; and
   a controlled contact force is applied between the control unit and the cold plate.

3. The rack assembly unit as claimed in claim 2, wherein:
   the fixing mechanism is defined by corresponding features of the rack chassis and the tray or control unit,
   the rack chassis comprises one or more fixing brackets;
   the tray or the control unit coupled to the tray comprises one or more corresponding fixing brackets; and
   a fixing screw is engaged to corresponding fixing brackets of each of the rack chassis and the tray or control unit, such that the position of the tray relative to the rack chassis is fixed in the closed position.

4. The rack assembly unit as claimed in claim 1,
   wherein the control unit when located at the control unit operating position is further electrically or communicatively coupled via the rack assembly unit with the vehicle rack system,
   the control unit having at least one connector comprising at least one of an electrical or communication connector and the rack assembly unit comprising a corresponding header and a backplane connector for coupling the control unit to a backplane board.

5. The rack assembly unit as claimed in claim 1,
   wherein the rack chassis comprises a cold plate support for receiving and supporting a cold plate, and the rack assembly unit is configured such that when the tray is located in a lower open position,
   wherein the control unit when located in the tray is spaced apart from the cold plate, and
   wherein the control unit when the tray is located in an upper closed position the tray is located such that a heat transfer surface of the control unit is thermally coupled to a heat transfer surface of the cold plate to form a thermal interface therebetween.

6. The rack assembly unit as claimed in claim 5, wherein:
   the rack chassis has first and second side walls;
   the cold plate support is defined by first and second recesses formed at a top edge surface of each of the first and second side walls; and
   the first and second recesses of the cold plate support are located opposite to each other, such that in use the cold plate is arranged extending between the first and second recesses and over a portion of the control unit located in tray.

7. The rack assembly unit as claimed in claim 1,
   wherein the coupling mechanism comprises a hinge mechanism, and
   wherein the tray and rack chassis are coupled at a rear portion of the rack assembly unit by the hinge mechanism being configured to provide for a rotational movement of the tray relative to the rack chassis.

8. The rack assembly unit as claimed in claim 7,
   wherein the tray and rack chassis are further coupled at a front portion of the rack assembly unit by a stop mechanism configured to define and to limit angular range of movement of the tray relative to the rack chassis between a lower open position of the tray and an upper closed position of the tray.

9. The rack assembly unit as claimed in claim 7, further comprising:

a hinge rotation stop defined by a hinge stop slot formed in a rear wall portion of the rack chassis and a hinge stop protrusion attached to the tray and receivable in the hinge stop slot, the hinge rotation stop being configured such that when the tray is tilted to the first open position relative to the rack chassis, the hinge stop protrusion is engaged with an upper edge surface of hinge stop slot and limits further tilting of the tray relative to the rack chassis.

10. The rack assembly unit as claimed in claim 1, wherein:

the coupling mechanism comprises a guided pin fixing mechanism, the tray and rack chassis are movably coupled at first and second side walls by the guided pin fixing mechanism to provide for movement by translation of the tray relative to the rack chassis between the first open position and the second closed position; and the tray and rack chassis comprise corresponding guide pins and guide slots located at the first and second side walls of each of the tray and rack chassis.

11. The rack assembly unit according to claim 10, wherein the movement of the tray relative to the rack chassis is controlled by a range of movement of each of the guide pins in each of the corresponding guide slots as defined by the guide slots, wherein the range of movement provides for translation of the tray relative to the rack chassis in horizontal (X) and vertical (Z) directions.

12. A vehicle rack server system comprising;

a rack support for receiving at least one rack assembly unit for mounting a control unit to the vehicle rack server system, the rack assembly unit having a rack chassis and a tray for receiving the control unit, wherein:

the tray is movably coupled to the rack chassis at a coupling mechanism, the coupling mechanism configured to provide for movement of the tray relative to the rack chassis between a first open position and a second closed position;

at the first open position, the tray is spaced apart from rack chassis to facilitate user access to the tray and to the control unit receivable therein; and at the second closed position, the tray is located fully inserted relative to the rack chassis and such that the control unit located in the tray is provided at a control unit operating position thermally coupled to a cold plate of a cooling system to provide for cooling of components of the control unit;

a backplane board comprising one or more backplane connectors for interfacing with said control unit;

a cold plate coupled to a cooling system, the cold plate located in the rack support and receivable on said rack assembly unit;

the vehicle rack server system further comprising:

a rack assembly unit located in a housing for mounting a control unit to the vehicle rack server system, the rack assembly unit comprising one or more headers and connectors coupled to the backplane board, and the cold plate located on the rack assembly unit;

a control unit located in said rack assembly unit;

wherein the rack assembly unit is configured such that when the control unit is located at the control unit operating position, the control unit is directly thermally coupled to the cold plate to provide heat transfer from the control unit to the cold plate;

wherein the control unit comprises a housing having a thermal interface receiver (TIM) receiver portion for receiving a TIM layer that, in the control unit operating position, is located between the control unit and the cold plate such that a heat transfer surface of the control unit and a heat transfer surface of the cold plate are thermally coupled via the TIM layer;

wherein the TIM receiver portion is defined by a recessed groove formed in an upper surface of the control unit, the recessed groove defining a periphery of the TIM receiver portion and having a shape generally corresponding to that of the cold plate; and wherein a seal is located in the recessed groove surrounding the TIM receiver portion.

13. The vehicle rack server system as claimed in claim 12, wherein:

the control unit comprises one or more electrical or communication connectors;

the rack assembly unit is configured such that when the control unit is located at the control unit operating position therein;

and the control unit is directly electrically or communicatively coupled to the backplane board via corresponding headers and connectors of the rack assembly unit.

* * * * *